(12) United States Patent
Gage et al.

(10) Patent No.: US 8,491,248 B2
(45) Date of Patent: *Jul. 23, 2013

(54) LOADLOCK DESIGNS AND METHODS FOR USING SAME

(75) Inventors: Chris Gage, Campbell, CA (US); Shawn Hamilton, Boulder Creek, CA (US); Sheldon Templeton, San Jose, CA (US); Keith Wood, Sunnyvale, CA (US); Damon Genetti, Livermore, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/229,497

(22) Filed: Sep. 9, 2011

(65) Prior Publication Data

US 2012/0003063 A1     Jan. 5, 2012

Related U.S. Application Data

(63) Continuation of application No. 11/998,528, filed on Nov. 30, 2007, now Pat. No. 8,033,769.

(51) Int. Cl.
*H01L 21/677* (2006.01)
(52) U.S. Cl.
USPC ............................ 414/217; 414/805; 414/935
(58) Field of Classification Search
USPC ..................... 414/217, 221, 805, 935; 34/403
See application file for complete search history.

(56) References Cited

U.S. PATENT DOCUMENTS

| | | | |
|---|---|---|---|
| 3,612,825 A | 10/1971 | Chase et al. | |
| 4,960,488 A | 10/1990 | Law et al. | |
| 5,228,208 A | 7/1993 | White et al. | |
| 5,308,989 A | 5/1994 | Brubaker | |
| 5,909,994 A | 6/1999 | Blum et al. | |
| 6,106,625 A | 8/2000 | Koai et al. | |
| 6,320,736 B1 | 11/2001 | Shamouilian et al. | |
| 6,518,195 B1 | 2/2003 | Collins et al. | |
| 7,105,463 B2 | 9/2006 | Kurita et al. | |
| 7,253,125 B1 | 8/2007 | Bandyopadhyay et al. | |
| 7,265,061 B1 | 9/2007 | Cho et al. | |
| 7,327,948 B1 | 2/2008 | Shrinivasan et al. | |
| 7,422,406 B2 | 9/2008 | van der Meulen | |

(Continued)

FOREIGN PATENT DOCUMENTS

| | | |
|---|---|---|
| JP | 06-037054 | 2/1994 |
| JP | 07-147274 | 6/1995 |

(Continued)

OTHER PUBLICATIONS

Gage et al., "Minimum Contact Area Wafer Clamping With Gas Flow for Rapid Wafer Cooling" Novellus Systems, Inc., U.S. Appl. No. 13/227,160, filed Sep. 7, 2011.

(Continued)

*Primary Examiner* — Scott Lowe
(74) *Attorney, Agent, or Firm* — Weaver Austin Villeneuve & Sampson LLP

(57) ABSTRACT

Provided are apparatuses and methods disclosed for wafer processing. Specific embodiments include dual wafer handling systems that transfer wafers from storage cassettes to processing modules and back and aspects thereof. Stacked independent loadlocks that allow venting and pumping operations to work in parallel and may be optimized for particle reduction are provided. Also provided are annular designs for radial top down flow during loadlock vent and pumpdown.

12 Claims, 17 Drawing Sheets

U.S. PATENT DOCUMENTS

| | | |
|---|---|---|
| 7,665,951 B2 | 2/2010 | Kurita et al. |
| 7,845,891 B2 | 12/2010 | Lee et al. |
| 8,033,769 B2 | 10/2011 | Gage et al. |
| 8,033,771 B1 | 10/2011 | Gage et al. |
| 2002/0005168 A1 | 1/2002 | Kraus et al. |
| 2002/0033136 A1 | 3/2002 | Savage et al. |
| 2004/0194268 A1 | 10/2004 | Halsey et al. |
| 2005/0226793 A1 | 10/2005 | Sakakura et al. |
| 2005/0258164 A1 | 11/2005 | Hiramatsu et al. |
| 2006/0075960 A1 | 4/2006 | Borgini et al. |
| 2006/0245852 A1 | 11/2006 | Iwabuchi |
| 2007/0205788 A1 | 9/2007 | Natsuhara et al. |
| 2007/0243057 A1 | 10/2007 | Shimada et al. |
| 2009/0142167 A1 | 6/2009 | Gage et al. |
| 2011/0318142 A1 | 12/2011 | Gage et al. |

FOREIGN PATENT DOCUMENTS

| | | |
|---|---|---|
| JP | 2005-116655 | 4/2005 |
| KR | 10-2003-0096732 | 12/2003 |
| WO | 00/60414 | 10/2000 |

OTHER PUBLICATIONS

U.S. Office Action for U.S. Appl. No. 12/140,196 mailed Jan. 4, 2012.

Chinese Office Action issued Nov. 2, 2011, for application No. 200810178496.6.

Notice of Allowance mailed Jun. 15, 2012, for U.S. Appl. No. 12/140,196.

Gage et al., "Transferring Heat in Loadlocks," Novellus Systems, Inc., U.S. Appl. No. 12/140,196, filed Jun. 16, 2008.

Gage et al., "Minimum Contact Area Wafer Clamping With Gas Flow for Rapid Wafer Cooling" Novellus Systems, Inc., U.S. Appl. No. 12/333,239, filed Dec. 11, 2008.

International Search Report and Written Opinion dated Aug. 2, 2010, from Application No. PCT/US2009/067040.

U.S. Office Action mailed Dec. 27, 2010, from U.S. Appl. No. 12/333,239.

U.S. Office Action mailed Dec. 14, 2010 for U.S. Appl. No. 11/998,528.

U.S. Final Office Action mailed Mar. 9, 2011, from U.S. Appl. No. 12/333,239.

U.S. Final Office Action mailed Apr. 7, 2011 from U.S. Appl. No. 11/998,528.

Notice of Allowance mailed Jun. 27, 2011, from U.S. Appl. No. 12/333,239.

Allowed Claims as of Jun. 27, 2011 from U.S. Appl. No. 12/333,239.

Notice of Allowance Action mailed Jun. 14, 2011 from U.S. Appl. No. 11/998,528.

Allowed Claims as of Jun. 14, 2011 from U.S. Appl. No. 11/998,528.

LOADLOCK DESIGNS AND METHODS FOR USING SAME

CROSS REFERENCE TO RELATED APPLICATIONS

This application is a continuation of and claims priority from U.S. patent application Ser. No. 11/998,528, filed Nov. 30, 2007, titled "LOADLOCK DESIGNS AND METHODS FOR USING SAME," all of which is incorporated in its entirety by this reference for all purposes.

BACKGROUND

Different types of tools are used to perform hundreds of processing operations during semiconductor device fabrication. Most of these operations are performed in vacuum chambers at very low pressure. Wafers are introduced to the process chambers with wafer handling systems that are mechanically coupled to the process chambers. The wafer handling systems transfer wafers from the factory floor to the process chamber. These systems include loadlocks to bring the wafers from atmospheric conditions to very low pressure conditions and back, and robots to transfer the wafers to various positions. Throughput—the number of wafers that is processed in a period of time—is affected by the process time, the number of wafers that are processed at a time, as well as timing of the steps to introduce the wafers into the vacuum process chambers. What are needed are improved methods and apparatuses of increasing throughput.

SUMMARY

The apparatuses and methods disclosed herein pertain to parallel processing of wafers. Specific embodiments include dual wafer handling systems that transfer wafers from storage cassettes to processing modules and back and aspects thereof. Stacked independent loadlocks that allow venting and pumping operations to work in parallel and may be optimized for particle reduction are provided. Also provided are annular designs for radial top down flow during loadlock vent and pumpdown.

One aspect of the invention relates to a stacked loadlock assembly for transferring substrates between an atmospheric environment and a vacuum transfer module. The assembly includes a lower loadlock having one or more chambers, each chamber having a substrate support and a sealable door selectively openable for transferring a substrate between the chamber and a transfer module robot and an upper loadlock disposed over the lower loadlock, the upper loadlock having one or more chambers, each chamber having a substrate support and a sealable door selectively openable for transferring a wafer between the chamber and a transfer module robot. The upper loadlock is isolated from the lower loadlock and the vertical distance between the upper and lower substrate transfer planes is no more than 100 mm, and in certain embodiments, no more than 70 mm. In certain embodiments, the height of the stacked loadlock assembly is no more than 10" as measured from the bottom of the lower loadlock chambers to the top of the upper loadlock chamber. Chamber volume typically ranges from about about 3 to about 20 L. In certain embodiments, each loadlock of the the stacked loadlock assembly has dual substrate chambers.

In certain embodiments, at least one loadlock of the stacked loadlock assembly in configured for radial venting and/or radial pumpdown. In certain embodiments, the upper loadlock is configured for radial pumpdown and the lower loadlock is configured for radial venting. Also in certain embodiments, each loadlock is configured for at least one of: radial pumping and radial venting. In certain embodiments, the the loadlock assembly does not have central pumping or venting ports.

Another aspect of the invention relates to a stacked loadlock assembly for transferring substrates from a first environment to a second environment, the assembly including a upper loadlock comprising one or more substrate chambers; a lower loadlocks comprising one or more substrate chambers, each upper loadlock substrate chamber disposed over a lower loadlock substrate chamber; and one or more center plates for isolating each lower loadlock substrate chamber from the overlying upper loadlock chamber, wherein each center plate defines the floor of the upper loadlock chamber and the ceiling of the lower loadlock chamber.

In certain embodiments, each center plate annular recesses, one annular recess that at least partially defines a flow path for pumping gas out of the upper loadlock chamber and another annular recess that at least partially defines a flow path for venting gas into the lower loadlock chamber.

In certain embodiments, the stacked loadlock assembly has at least one upper aperature for transferring substrates in and/or out of the upper loadlock and at least one lower aperature for transferring substrates in and/or out of the lower loadlock. The at least one upper aperature is separated from the at least one lower aperature by a vertical distance of no more than about 100 mm. The height of the assembly is no more than 10" chamber height in certain embodiments. Also, in certain embodiments, the stacked loadlock assembly has one or more upper loadlock lids for covering the one or more upper loadlock chambers, wherein each lid has an annular recess that at least partially defines a flow path for venting gas into the lower loadlock chamber.

Another aspect of the invention relates to a method of transferring substrates between an atmospheric environment and a vacuum environment using a loadlock apparatus, which according to various embodiments may have one or more of the following features: a lower loadlock having one or more chambers, each chamber having a substrate support and a sealable door selectively openable for transferring a substrate between the chamber and a transfer module robot; an upper loadlock disposed over the lower loadlock, the upper loadlock having one or more chambers, each chamber having a substrate support and a sealable door selectively openable for transfering a wafer between the chamber and a transfer module robot. The method includes transferring one or more substrates between the atmospheric environment and the one or more upper loadlock chambers on an upper loadlock substrate horizontal transfer plane; transferring one or more substrates between the vacuum environment and the one or more loadlock chambers on a lower loadlock substrate horizontal transfer plane; wherein the upper loadlock is isolated from the lower loadlock and the vertical distance between the upper and lower substrate horizontal transfer planes is no more than 100 mm.

Another aspect of the invention relates to a loadlock apparatus for radially venting a loadlock chamber containing a wafer. The apparatus includes a wafer support in said loadlock chamber, a side inlet port, said side inlet port opening into an annular chamber located above said loadlock chamber, said annular chamber connected to an annular stepped narrow channel for directing flow parallel to a wafer on the support. According to various embodiments, the loadlock apparatus may include one or more of the following features: a loadlock housing defining the side inlet port and an upper plate defining the ceiling of the loadlock chamber and a loadlock housing, wherein the annular channel is defined by the loadlock housing and a recessed portion of the upper plate. In certain embodiments, annular sections of the upper plate and loadlock housing are stepped, with the outer diameter of the stepped section of the plate less than the inner diameter of the stepped section of the loadlock housing to thereby define the annular stepped channel. The width of the annular stepped narrow channel is between about 0.005 to 0.050 inches in certain embodiments. The stepped channel may include an outer section parallel to a wafer surface, a perpendicular section, and an inner parallel section. In certain embodiments, the dimensions of a rectangular cross-section of the annular chamber range from about 0.25-1.5 inches. Also, in certain embodiments, the side inlet port, the annular chamber and annular stepped narrow channel define a flow path for gases vented into the loadlock chamber. The annular stepped narrow channel chokes the vent gas flow in certain embodiments.

Yet another aspect of the invention, relates to loadlock apparatus for radially pumping down a loadlock chamber containing a wafer. The apparatus includes a wafer support in said loadlock chamber, a side outlet port opening into an annular chamber, the annular chamber located below said wafer support; a narrow annular channel connecting the loadlock chamber to the annular chamber for directing flow into the annular chamber. The inner diameter of the annular channel is greater than the wafer support diameter. The loadlock apparatus may also include a loadlock housing defining the side outlet port. In certain embodiments, the apparatus includes a lower plate defining the floor of the loadlock chamber and a loadlock housing, wherein the annular channel is defined by the loadlock housing and a recessed portion of the lower plate. The apparatus may also include a loadlock housing, wherein the outer diameter of a section of the plate is less than the inner diameter of a section of the loadlock housing to thereby define the annular channel. In certain embodiments the width of the narrow annular channel is between about 0.005 to 0.050 inches and the dimensions of a rectangular cross-section of the annular chamber range from about 0.25-1.5 inches.

Yet another aspect of the invention relates to a stacked loadlock apparatus that includes a lower loadlock chamber having a wafer support in said upper loadlock chamber, a side inlet port, said side inlet port opening into an upper annular chamber located above said upper loadlock chamber, said annular chamber connected to an annular stepped narrow channel for directing flow parallel to a wafer on the support; and an upper loadlock chamber comprising a wafer support in said upper loadlock chamber, a side outlet port opening into an annular chamber, an annular chamber located below said wafer support; a narrow annular channel connecting the loadlock chamber to the annular chamber for directing flow into the annular chamber, the inner diameter of the annular channel greater than the wafer support diameter.

A further aspect of the invention relates to a method of venting a loadlock chamber containing a wafer, said loadlock chamber comprising: a wafer support in said loadlock chamber, a side inlet port, said side inlet port opening into an annular chamber located above said loadlock chamber, said annular chamber connected to an annular stepped narrow channel for directing flow parallel to a wafer on the support. The method may include inleting gas through the annular chamber, such that the gas flows into the annular stepped narrow channel to thereby direct a radial flow of the gas into the loadlock chamber parallel to the wafer.

A method of pumping down a loadlock chamber containing a wafer, said loadlock chamber comprising: a wafer support in said loadlock chamber, a side outlet port opening into an annular chamber, the annular chamber located below said wafer support; a narrow annular channel connecting the loadlock chamber to the annular chamber for directing flow into the annular chamber. The method may include radially pumping gas outward from the center of the wafer by pumping gas through the side outlet port such that the gas is choked through the annular channel into the annular chamber.

These and other aspects and advantages of the invention are described in the detailed description which follows.

DETAILED DESCRIPTION

Overview

Figure 1:
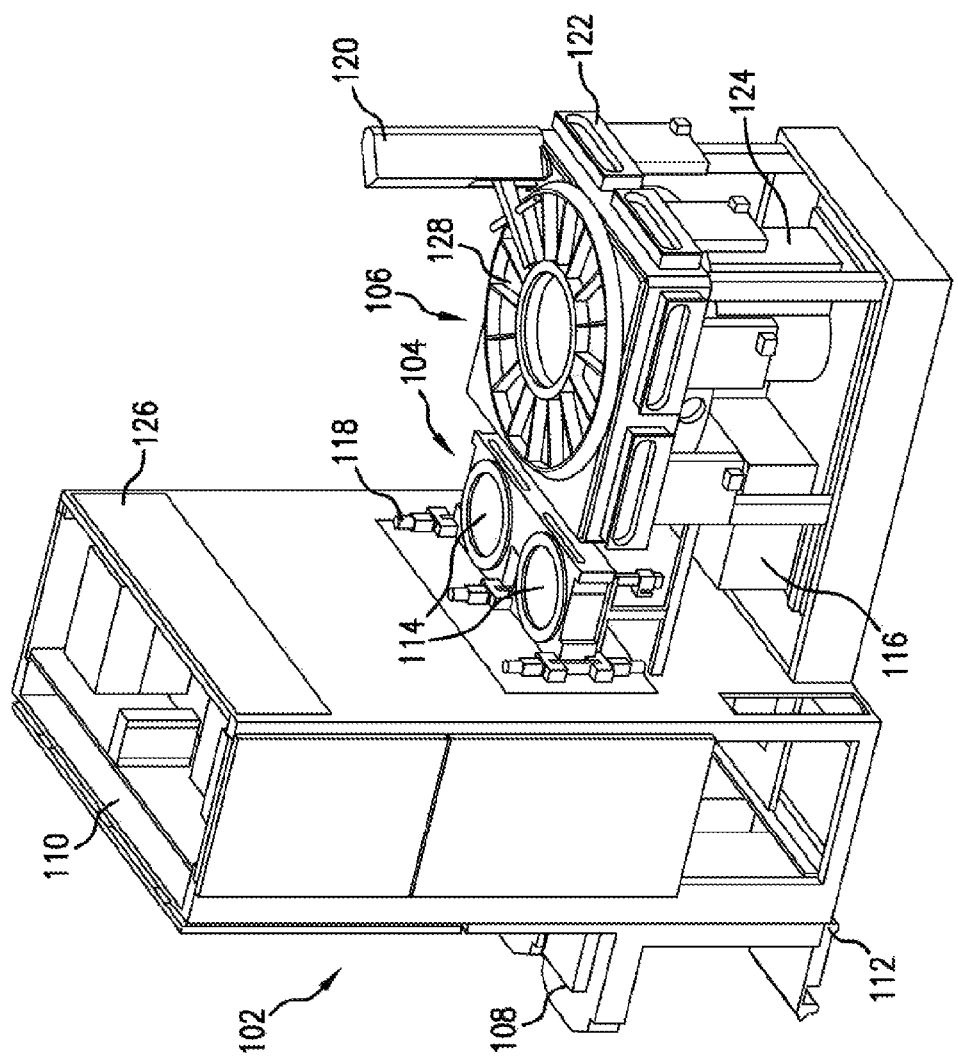
FIG. 1 is a schematic of an exterior of a dual wafer handling apparatus and components thereof according to various embodiments.

FIG. 1 shows an exterior of dual wafer handling apparatus and components thereof according to aspects of the invention. The apparatus shown in FIG. 1 may be used to transfer wafers from atmospheric conditions (e.g, to and from a storage unit) to one or more processing chambers (e.g., PECVD chambers) and back again. The apparatus shown in FIG. 1 has three main components: an atmospheric environment 102, loadlocks 104 and a transfer module 106. Storage units (e.g., Front Opening Unified Pods or FOUPs) and processing chambers are not shown in the figure. Atmospheric environment 102 is typically at atmospheric pressure and can interact with FOUPs and/or parts of the external facility. Transfer module 106 is typically at sub-atmospheric pressure and can be in communication with the loadlocks and various processing chambers which are often run at vacuum or low pressure. Wafers are placed in loadlocks 104 for pump-down or vent operations when transitioning between atmospheric and sub-atmospheric environments.

The atmospheric environment 102 (also referred to as a 'mini-environment') contains an atmospheric robot (not shown) that transfers wafers to and from FOUPs and loadlocks 104. Pod loaders 108 receive and support FOUPs so that they may be accessed by the atmospheric robot. The atmospheric environment 102 typically contains an overhead fan filter unit, e.g., a HEPA filter unit, to prevent contaminants from entering the atmospheric environment. The air inlet 110 for the fan filter unit is shown in FIG. 1. The lower boundary of the atmospheric or mini-environment may be a false floor, such as that depicted in FIG. 1 at 112.

Loadlocks 104 receive inbound (unprocessed) wafers from the atmospheric environment 102 to be transferred to the process chambers, and outbound (processed) wafers from the transfer module 106 to be transferred back to the FOUPs. A loadlock may be bidirectional (holding inbound and outbound wafers) or unidirectional (holding only inbound or outbound wafers). In certain embodiments, the loadlocks are unidirectional. Inbound wafers are also referred to herein as incoming or unprocessed wafers; outbound wafers are also referred to herein as outgoing or processed wafers.

In FIG. 1, there are two independent loadlocks: an upper loadlock stacked on top of a lower loadlock, each having two connected chambers. In certain embodiments, the upper loadlock is an inbound loadlock and the lower loadlock is an outbound loadlock. Plates 114 are lids of the inbound loadlock, each plate covering one of the two connected chambers. Loadlock vacuum pumps 116 are used to pump down the loadlocks as necessary during operation.

Atmospheric valve doors 118 provide access to the loadlocks from the atmospheric environment 102. In the embodiment shown, a four door slit valve externally mounted to the mini-environment is used, though any type of doors or valves including gate valves, sliding doors, rotational doors, etc., may be used.

The transfer module is configured to be attached to one or more process modules (e.g., single or multi-station PECVD chambers, UV cure chambers, etc.). A process module may be attached to the transfer module 106 at multiple interface locations/sides of the transfer module. Slit valves 122 provide access from the transfer module to the process modules. Any appropriate valve or door system may be used. In FIG. 1, there are two valves per side—allowing two wafers to be transferred between a loadlock and a process module (e.g., between two chambers of a loadlock and two adjacent stations of a process module) or between two process modules. Transfer module lift assembly 120 is used to raise and lower the cover 128 of the transfer module. In FIG. 1, cover 128 is down (i.e., the interior of the transfer module is not shown in the figure). A vacuum transfer robot is located in the interior of the transfer module to transfer wafers between the loadlocks and the process modules or from process module to process module.

The transfer module 106 is maintained at sub-atmospheric pressure, and is sometimes referred to herein as a vacuum transfer module. Transfer module pressure is typically between 760 torr-1 militorr, though in certain embodiments the tool may be used for even lower pressure regimes. Once an inbound wafer is in place in the loadlock, the loadlock vacuum pumps 116 are used to pump down the loadlock to a sub-atmospheric pressure so that the wafer may be subsequently transferred to the vacuum transfer module. Loadlock slit valves 130 provide access to the loadlocks from the transfer module 106. Transfer module vacuum pump 124, along with a gas mass flow controller (MFC), a throttle valve and a manometer, is used to obtain and maintain the desired pressure of the transfer module. In general, on-tool or off-tool vacuum pumps may be used for the transfer module. As is known in the art, various methods of controlling pressure in the transfer module exist. In one example, a MFC provides a constant flow of N2 gas into the transfer chamber. The manometer provides feedback as to the pressure of the transfer module chamber. The vacuum pump removes a constant volume of gas per unit time as measured in cubic feet per minute. The throttle valve actively maintains a pressure set point through the use of a closed loop control system. The throttle valve reads the manometer's pressure feedback, and based on the commands from the valve's control system, adjusts the opening of the effective orifice to the vacuum pump.

An access panel 126 provides access to an electronics bay that contains a control system to control the wafer handling operations, including robot movements, pressure, timing, etc. The control system may also control some or all operations of processes performed in the process module. The controllers, switches, and other related electrical hardware can be located elsewhere according to various embodiments.

Figure 2A:
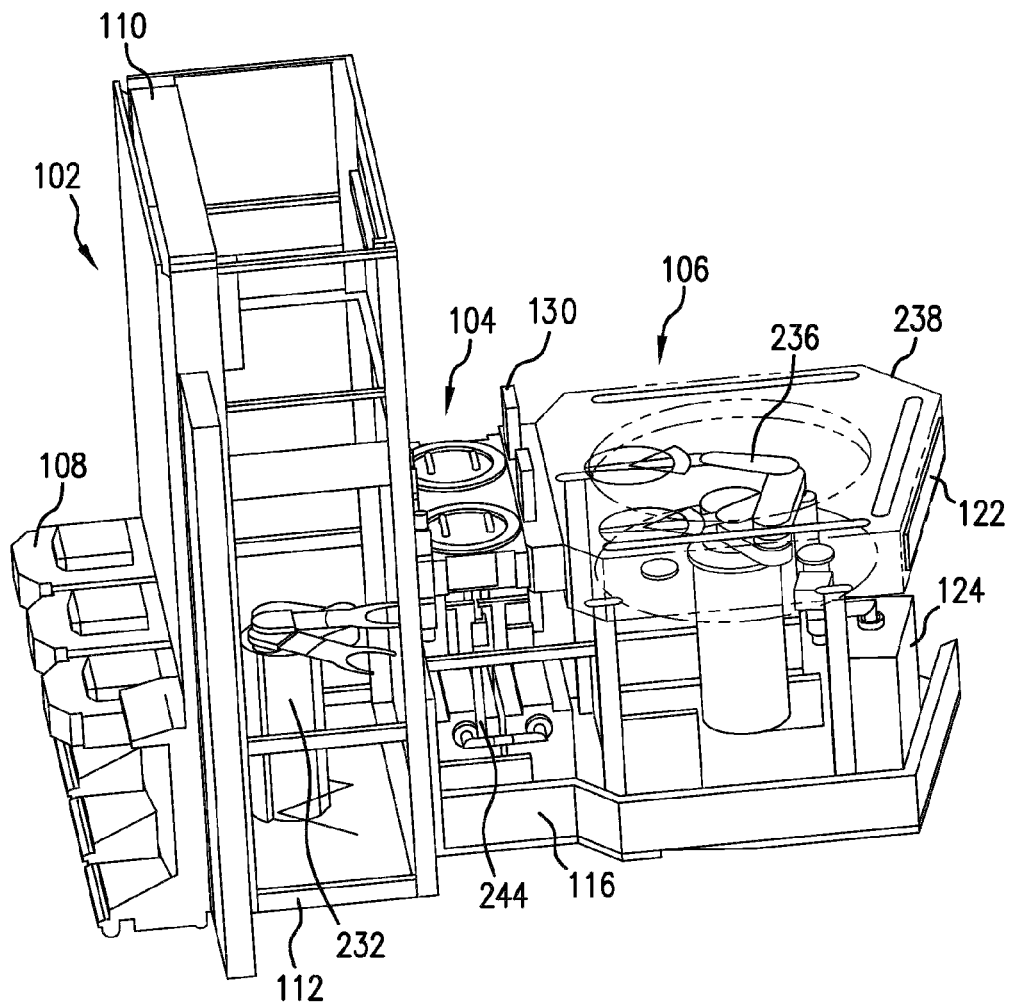
FIGS. 2a and 2b are schematics of a dual wafer handling apparatus that show internal views of the atmospheric environment and the transfer module according to various embodiments.
Figure 2B:
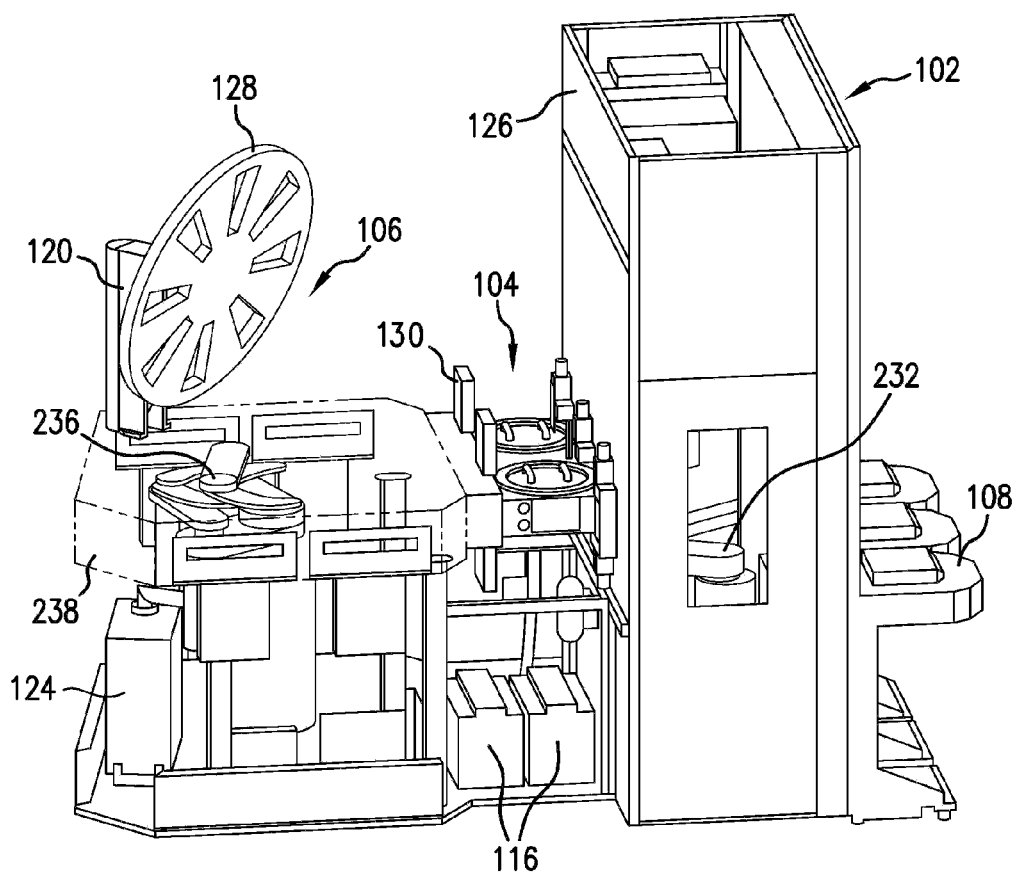

FIGS. 2*a* and 2*b* are additional schematics of a dual wafer handling apparatus that show internal views of the atmospheric environment 102 and transfer module 106. The apparatus shown in FIGS. 2*a* and 2*b* is substantially that shown in FIG. 1, except that the shape of the transfer module of the apparatus in FIGS. 2*a* and 2*b* is a trapezoid to allow a larger access 238 area to service the transfer module. The transfer module lift assembly and lid, and a portion of the atmospheric environment casing are not shown in FIG. 2*a*.

The atmospheric environment or mini-environment 102 contains an atmospheric robot 232. The transfer module 106 contains a vacuum robot 236. In the embodiment depicted in FIG. 2*a*, the atmospheric robot 232 has one arm, with two articulated wrists, each of which has a paddle or other end effector capable of carrying a wafer. Vacuum transfer robot 236 has two arms, each with two paddles capable of carrying a wafer. The atmospheric robot is capable of handling two wafers simultaneously and the vacuum robot can simultaneously carry up to four wafers. (The apparatus and methods described herein are not limited to these particular robot designs, though generally each of the robots is capable of simultaneously handling and/or transferring, and/or exchanging at least two wafers.)

FIG. 2*a* also provides a partial view of a pipe 244, also referred to the loadlock pump foreline that leads from a manifold to the vacuum pumps 116. Dual vacuum pumps 116 work in tandem and are used to pumpdown both loadlocks. According to various embodiments, the dual pumps may function as a single pump resource or could be dedicated to a specific loadlock for parallel pump downs. FIG. 2*b* shows a schematic of the apparatus shown in FIG. 2*a* from the opposite side. The transfer module lift assembly 120 and the transfer module lid 128 are shown in an upright position.

Figure 3A:
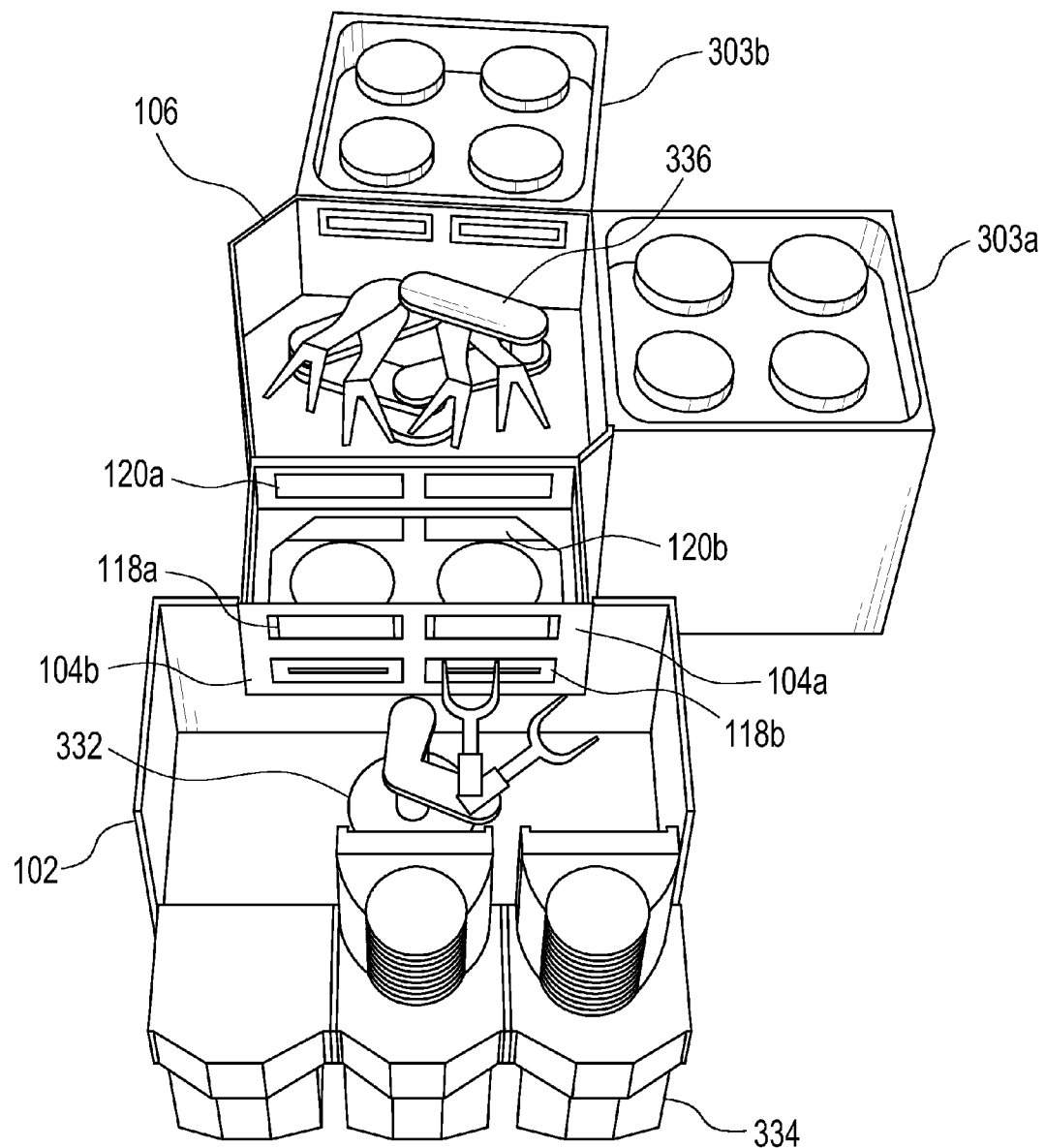
FIGS. 3a-e are graphical representations showing top views of a dual wafer transport apparatus performing certain operations in dual wafer transport of a pair of wafers from a storage cassette to a wafer transfer module and back according to certain embodiments.

FIGS. 3*a-f* are graphical representations showing certain operations in dual wafer transport of a pair of wafers from FOUPs to the wafer transfer module and back. FIG. 3*a* shows an apparatus with transfer module 106, upper (inbound) loadlock 104*a*, lower (outbound) loadlock 104*b* and atmospheric environment 102. Also shown are process modules 330*a* and 330*b*. At this point, prior to their entry into atmospheric environment 102, wafers are located in e.g., FOUPs 334, which interface with the atmospheric environment 102. The atmospheric environment 102 contains an atmospheric robot 332; the transfer module 106 contains a vacuum robot 336.

As indicated above, the apparatus is capable of parallel transport and processing of two wafers. Both the atmospheric and transfer module vacuum robots are capable of simultaneous handling at least two wafers.

Atmospheric robot 332 has one arm, with two articulated wrists, each of which has gripper or blade capable of carrying a wafer. Vacuum transfer robot 336 has two arms, each with two blades or grippers capable of carrying a wafer.

Figure 3B:
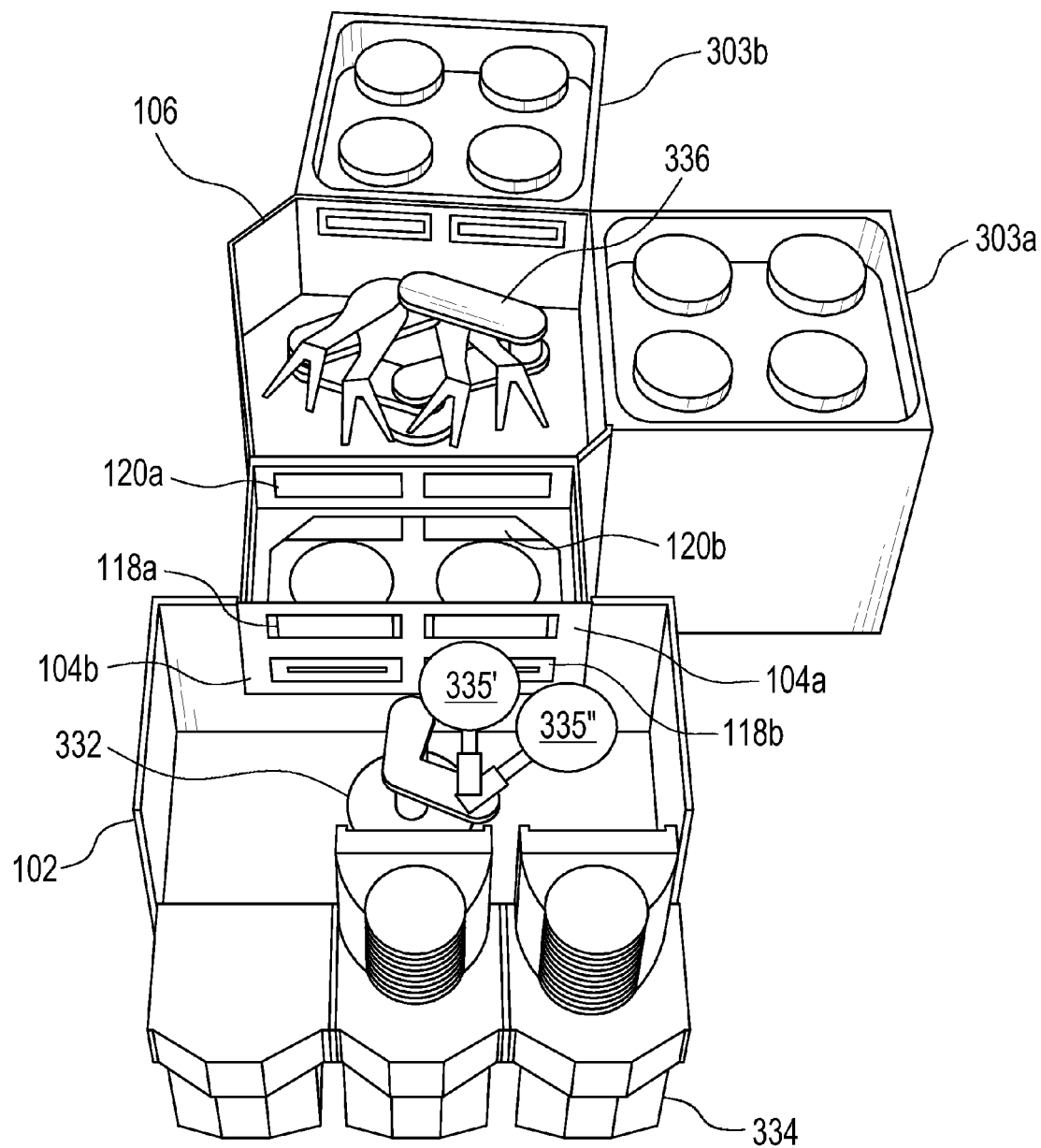
Figure 3C:
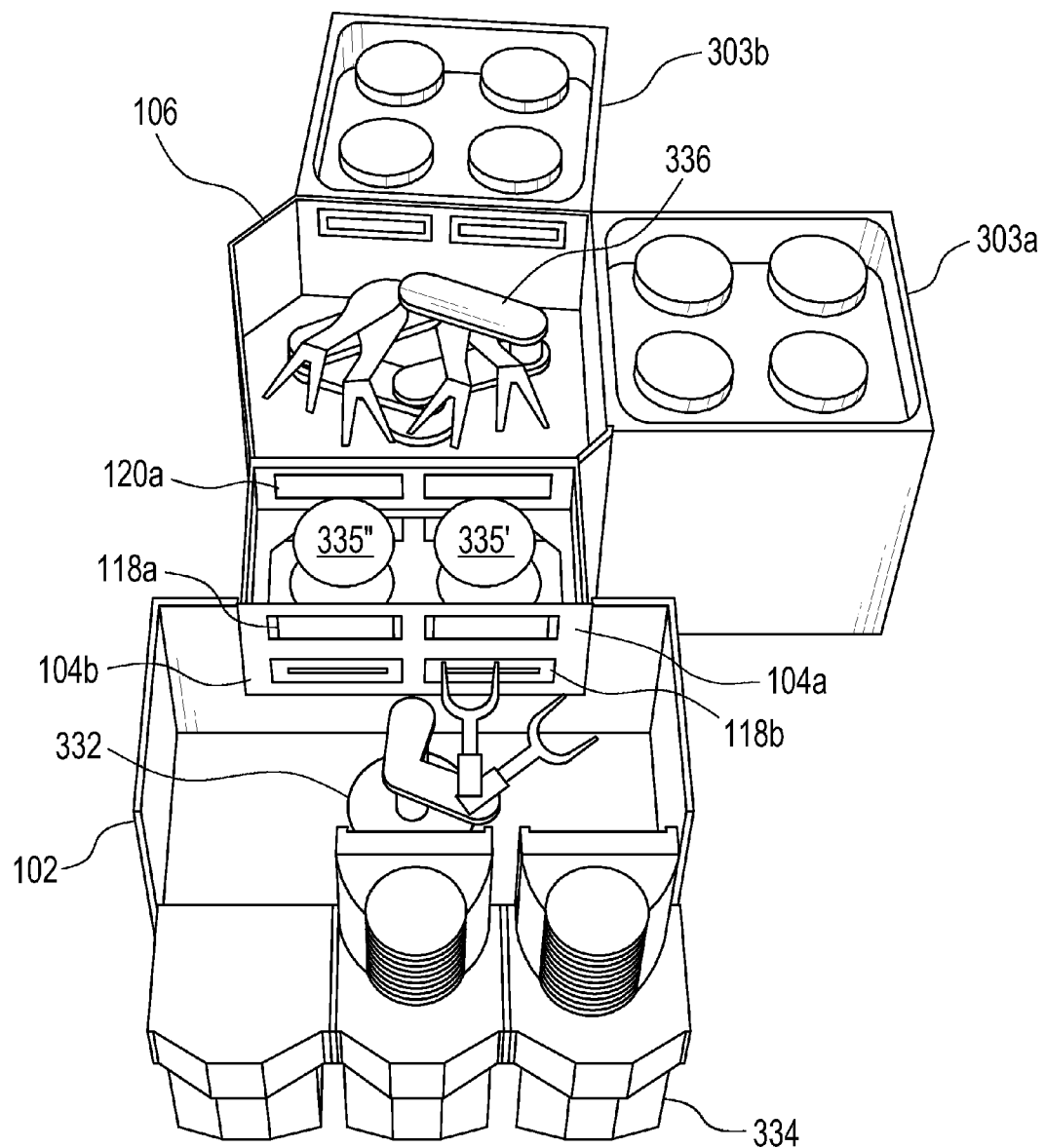
Figure 3D:
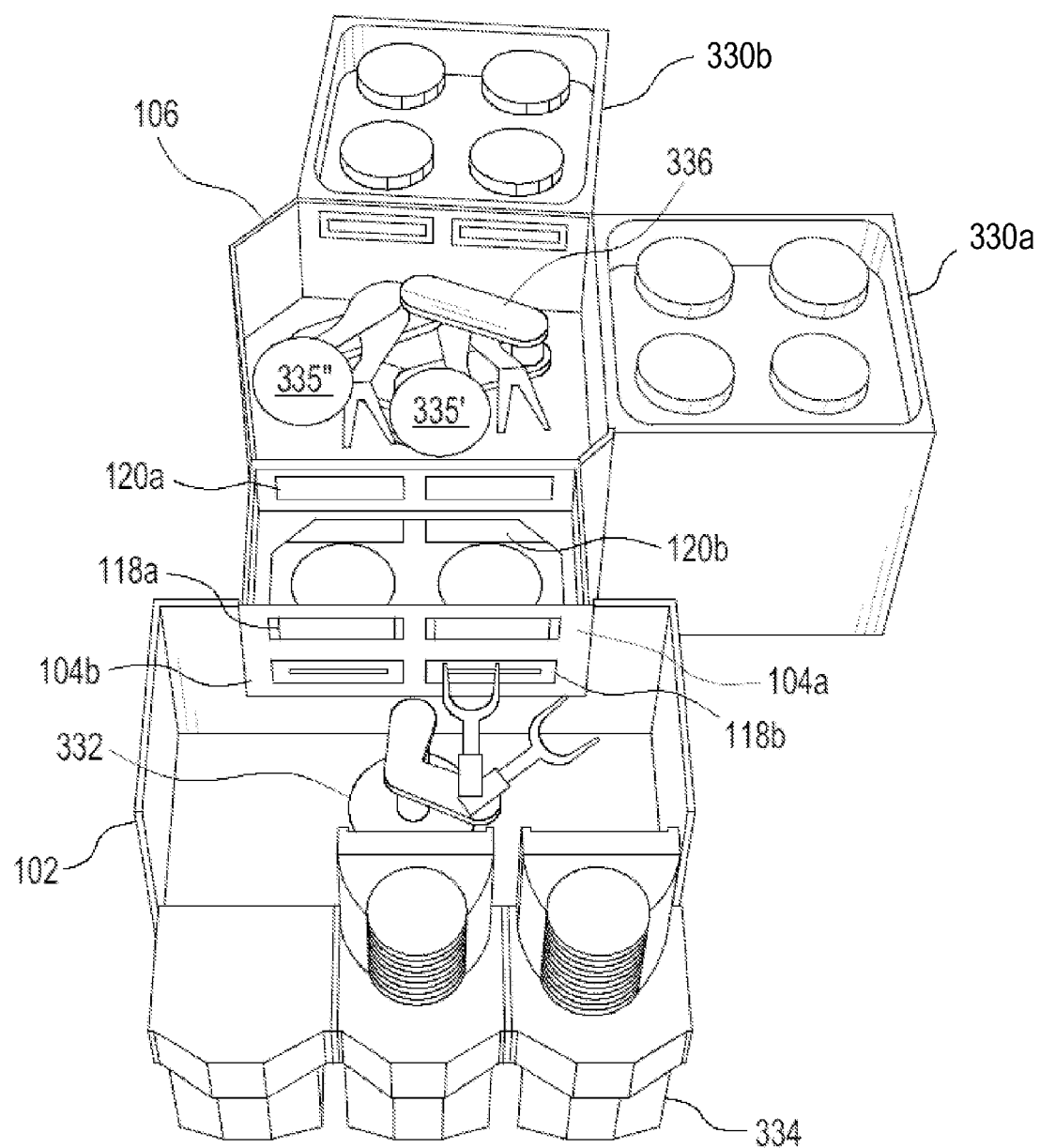
Figure 3E:
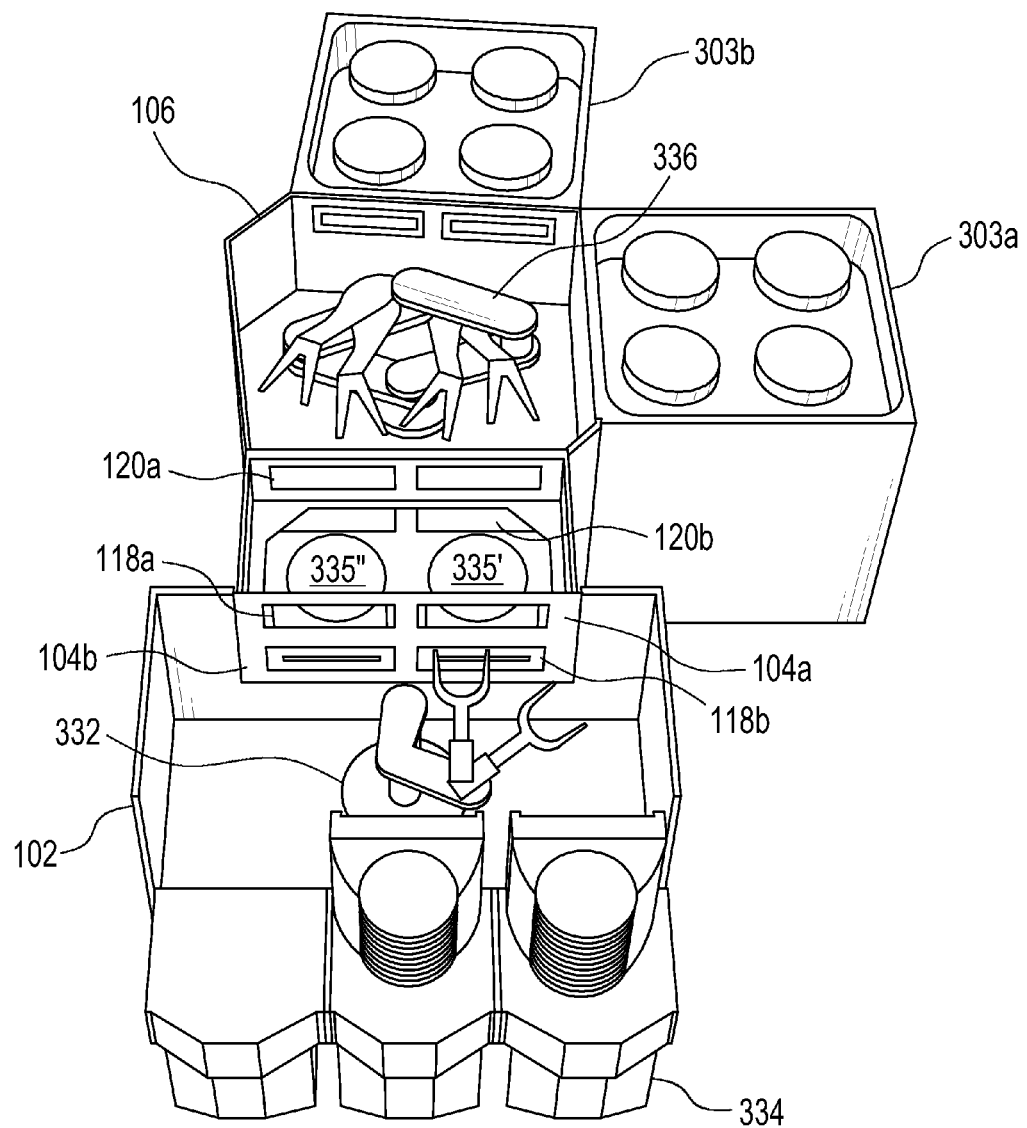
Figure 3F:
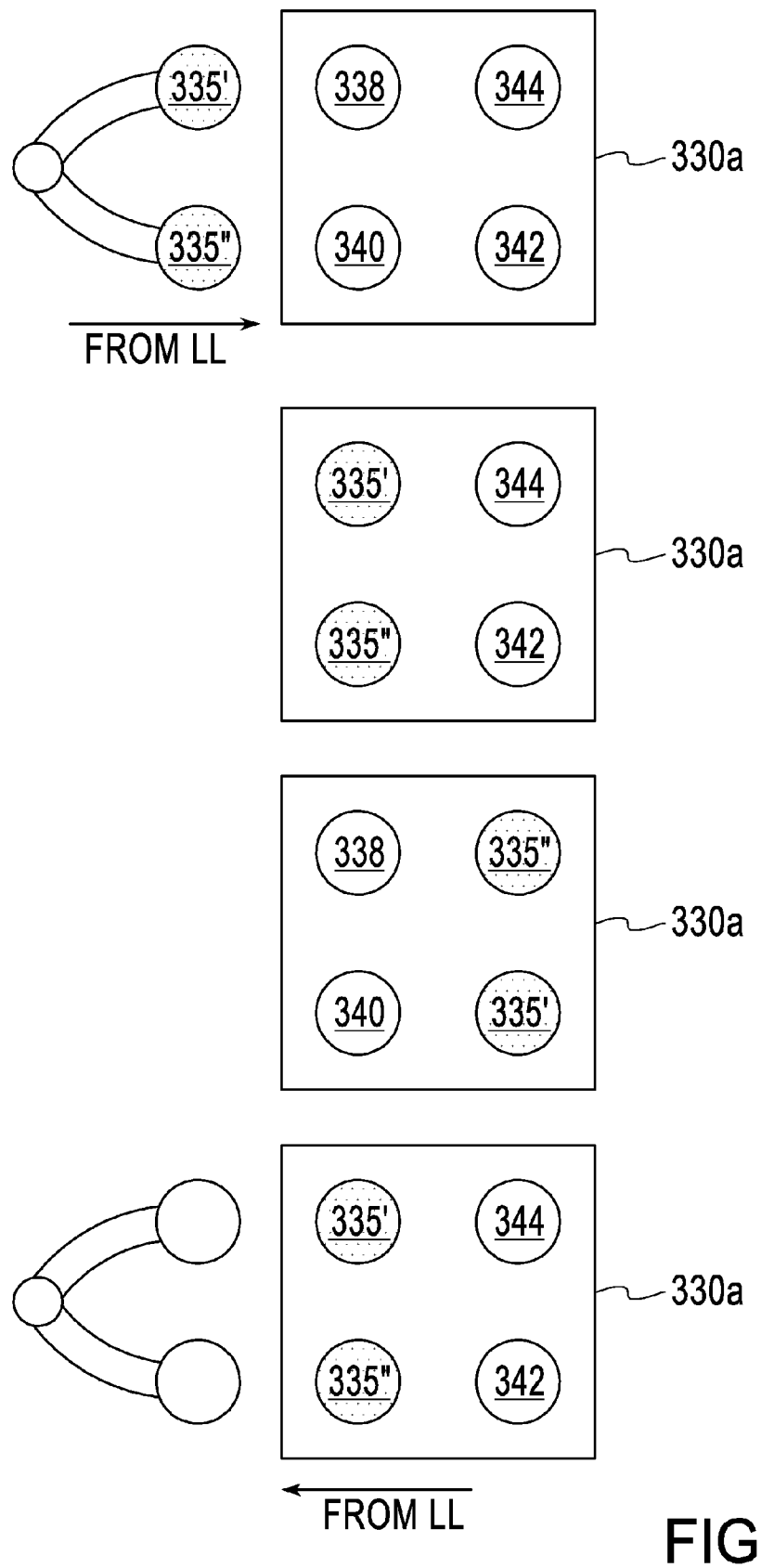
FIG. 3f shows an example of a sequence of movements a pair of wafers may undergo in a process module according to certain embodiments of the methods and apparatuses described herein.

The atmospheric robot takes two wafers from FOUPs. (The movement of a robot to take a wafer from a location such as a FOUP, loadlock or processing station is sometimes referred to herein as a "pick" move, while the placement of a wafer to a location by the robot is sometimes referred to herein as a "place" move. These moves are also referred to herein as "get" and "put" moves, respectively.) Depending on the robot and the arrangement of the FOUPs or other wafer storage, the two wafers may be taken simultaneously or one after another. In the embodiment depicted in FIG. 3a, for example, the atmospheric robot has one arm with two articulated wrists and is capable of simultaneous transfer of two stacked wafers, e.g., simultaneous picks of two stacked wafers from a FOUP. FIG. 3b shows the atmospheric robot 332 with two wafers 335' and 335" during transfer from the FOUP the upper loadlock 104a. The atmospheric robot then places the wafers into the upper loadlock 104a for depressurization. This is shown in FIG. 3c. One wafer is in each chamber. Once the wafers are placed in the upper loadlock, the atmospheric doors 118a of the upper loadlock close and the loadlock is pumped down. When the desired pressure is reached, the upper loadlock doors 120a on the transfer module side are open and transfer module robot 106 picks the wafers from the upper loadlock. FIG. 3d shows transfer module robot 106 with wafers 335' and 335". The transfer module robot depicted in FIGS. 3a-e has two arms, each with two end effectors and is capable of holding four wafers simultaneously. In the embodiment shown, the upper loadlock does not have passive wafer centering, nor are there independent z-drives in the loadlock for each of the wafers. In certain embodiments, the vacuum robot picks the wafer simultaneously and cannot selectively pick one wafer if two wafers are present in the incoming loadlock. However, depending on the robot and the system, the transfer module robot may pick each wafer simultaneously or consecutively. Also depending on the robot and the system, the robot may use one arm with two end effectors to pick both wafers, or each wafer may be picked by a different arm. After picking the unprocessed wafers from the inbound loadlock, the transfer module robot transfers the wafers to a processing module, i.e., either process module 330a or process module 330b, by rotating and placing the wafers in the process module. Although not depicted in FIGS. 3a-e, there may also be a third processing module connected to the transfer module. The wafers then undergo processing in the process module. FIG. 3f shows an example of a sequence of movements the wafers may undergo in a process module 330a. First, wafer 335' is placed in station 338 of processing module 330a and wafer 335" is placed in station 340 of processing module 330a. The wafers then undergo processing at these stations. Wafer 335" moves from station 340 to station 344 and wafer 335' from station 338 to station 342' for further processing. The wafers are then returned to their original stations to be picked by the transfer module robot for transfer to the outbound loadlock or to process module 330b for further processing. For clarity, the stations are depicted as 'empty' in the figure when not occupied by wafers 335' and 335", in operation all stations are typically filled by wafers. The sequence illustrated in FIG. 3f is just an example of a possible sequence that may be employed with the apparatuses described herein. The transfer module robot picks both wafers up for simultaneous transfer to the loadlock. The pick moves may occur simultaneously or consecutively. The robot then rotates to place the processed wafers in the loadlock. Again, these moves may occur simultaneously or consecutively according to various embodiments. FIG. 3e shows the now processed wafers 335' and 335" placed in the outbound (lower) loadlock 104b via lower loadlock doors 120b. After being placed there, all loadlock valves or doors are shut and the outbound loadlock is vented (pressurized) to atmospheric pressure. The wafers may also be cooled here. The atmospheric doors 118b of the outbound loadlock are then opened, and the atmospheric robot picks up the processed wafers and transfers them to the appropriate place in the FOUP.

It should be noted that the dual wafer processing apparatuses with multiple process chambers and methods discussed herein can be used for parallel or sequential processing. In a parallel processing scheme, a set of wafers is processed in one process module and then returned to the FOUP, while other set(s) of wafers are processed in parallel in other process module(s). In a sequential processing scheme, a set of wafers is processed in one process module, and then transferred to another process module for further processing prior to being returned to atmospheric conditions. Mixed parallel/sequential sequences are also possible, e.g., in which two process modules (PM1 and PM2) are used for parallel processing and then all wafers from these process modules are transferred to a third process module (PM3) for further processing. Likewise a first process module may process all wafers, which are then sent to either a second or third module for parallel processing.

Unidirectional Flow

In certain embodiments, the loadlocks are used in unidirectional operation mode. An example of inbound and outbound loadlocks, atmospheric robot and transfer module robot moves in a unidirectional flow scheme is given below in Table 1:

TABLE 1

Robot and Loadlocks Moves in Unidirectional Flow Operation

| ATM Robot | Incoming LL (Upper) | Outgoing LL (Lower) | TM Robot |
|---|---|---|---|
| FOUP Pick (1) | Vent (Empty) | TM Robot | Lower LL Place (arm 2) |
| Upper LL Place (2) | ATM Robot (2) | Vent/Cool (Wafers) | PM Pick (arm 2) |
| Lower LL Pick | Pumpdown (Wafers) (3) | ATM Robot | PM Place (arm 1) |
| FOUP Place | TM Robot (4) | Pumpdown (Empty) | Upper LL Pick (arm 1) (4) |
| FOUP Pick | Vent (Empty) | TM Robot | Lower LL Place (arm 2) |
| Upper LL Place | ATM Robot | Vent/Cool (Wafers) | PM Pick (arm 2) (1') |
| Lower LL Pick | Pumpdown (Wafers) | ATM Robot | PM Place (arm 1) (5) |
| FOUP Place | TM Robot | Pumpdown (Empty) | Upper LL Pick (arm 1) |
| FOUP Pick | Vent (Empty) | TM Robot | Lower LL Place (arm 2) (2') |
| Upper LL Place | ATM Robot | Vent/Cool (Wafers) (3') | PM Pick (arm 2) |
| Lower LL Pick (4') | Pumpdown (Wafers) | ATM Robot (4') | PM Place (arm 1) |
| FOUP Place (5') | TM Robot | Pumpdown (Empty) | Upper LL Pick (arm 1) |

Table 1 presents an example of a sequence of unidirectional operational mode in which the transfer module robot hand-off sequence is process module (wafer exchange)→outgoing loadlock (place processed wafers)→incoming loadlock (pick unprocessed wafers). This is an example of one possible sequence—others may be used with the dual wafer handling apparatuses described herein. In a specific example, the transfer module robot-handoff sequence is process module (wafer exchange)→incoming loadlock (pick unprocessed wafers) →outgoing loadlock (place processed wafers).

Rows can be read as roughly simultaneously occurring or overlapping operations. Columns show the sequence of operations the robot or loadlock performs. Of course, in any system, these operations may not overlap exactly and one or more of the modules may be idle or begin or end later. Further, it should be noted that certain operations are not shown. The rotational and translational moves the robots must perform to reach the pods, loadlocks and process modules are not shown. The descriptions 'TM Robot' and 'ATM Robot' can refer to the moves the loadlocks undergo—opening and closing the appropriate doors—as well as admitting the robot end effectors to pick or place the wafers.

The path of a pair of unprocessed wafers going from a FOUP to a process module is traced in the Table in steps 1-5:
1—ATM Robot FOUP Pick
2—ATM Robot Upper Loadlock Place
3—Upper LL Pumpdown (see FIG. 3c)
4—TM Robot Pick
5—TM Robot Process Module Place The path of a pair of processed wafers going from a process module to a FOUP is traced in the Table in steps 1'-5':
1'—TM Robot Process Module Pick
2'—TM Robot Lower LL Place
3'—Lower LL Vent/Cool (see FIG. 3e)
4'—ATM Robot Lower LL Pick
5'—ATM Robot FOUP Place As can be seen from the Table 1, once outgoing wafers are handed off to an atmospheric robot, for example, the loadlock can then be pumped down—it does not have to wait for the atmospheric robot to complete its moves before pumping down. This is distinguished from bidirectional operation in which a loadlock is idle while the atmospheric robot places the processed wafers in a FOUP or other cassette and gets two unprocessed wafers from a cassette for placement into the loadlock. Various robot and loadlock moves according to certain embodiments are described below.

Incoming LL

Pumpdown: Pressure in the upper loadlock is lowered from atmospheric to a predetermined subatmospheric pressure. As described below with reference to FIGS. 6a and b, the loadlock is pumped down by pulling gas through a narrow gap around the pedestal. The gap is pumped into a larger cross section ring below the pedestal and is then pumped out from the side. This keeps the flow outward (radial flow from the wafer center) and downward from the wafer—to avoid drawing any particles up to the wafer. This pumpdown operation is rapid.

Vent: Vent the upper loadlock from a subatmospheric pressure to atmospheric. No wafer is present. The upper loadlock may be vented radially as described below with reference to FIG. 6a. Like the pump down operation, the vent operation is fairly rapid.

Examples of timing of Incoming LL Moves (secs):
Open/Close VAT Valve (Valve to Atmospheric environment): 0.5
Open/Close slit valve (valve to transfer module): 0.5
Verify slit valve closed, vent, verify at atmosphere: several seconds
Verify VAT door closed, pumpdown and transfer module pressure match: several seconds Outgoing LL Vent/Cool: Vent the lower loadlock from a subatmospheric pressure to atmospheric pressure. Venting is done by flowing gases such as helium and/or nitrogen into the chamber. The helium enters through an annular gap at an 8 inch diameter above the wafer. Flow is top-down and radially outward over the wafer to avoid drawing particles up to the wafer. The wafers enter the lower loadlock needing to be cooled from processing. In one embodiment, helium is first vented into the chamber as a heat transfer gas, to an intermediate pressure. Gas flow is then stopped while the wafer cools. Nitrogen is then flowed to get the pressure up to atmospheric.

Pumpdown: Pump the lower loadlock from atmospheric to a pre-determined subatmospheric pressure. The chambers are empty.

Examples of timing of Outgoing LL Moves (secs):
Open/Close VAT Valve (valve to atmospheric environment): 0.5
Open/Close slit valve (valve to transfer module): 0.5
Verify slit valve closed, He vent, verify at atmosphere: several seconds
Verify VAT door closed, pumpdown and transfer module pressure match: several seconds ATM Robot FOUP Pick: The atmospheric robot picks two stacked unprocessed wafers from a FOUP or other cassette. In one embodiment, the end effectors are stacked on top of the other and pick the stacked wafers simultaneously. After picking the wafers, the end effectors are rotated with respect to each other, and the arm is rotated to place the wafers in the upper loadlock (see FIG. 3b, which shows a single arm dual end effector robot holding two wafers ready to place them into the upper loadlock).

Upper LL Place: The atmospheric robot places the wafers into the upper loadlock chambers. In certain embodiments, first one end effector is extended into a chamber of the upper loadlock and lowers the wafer onto the shelf. The end effector is then retracted from the loadlock and the second end effector is extended into the other chamber of the upper loadlock and lowers the wafer onto the shelf. The robot thus places the left and right wafers consecutively, in either order.

Lower LL Pick: The atmospheric robot picks the wafers from the lower loadlock chambers. In certain embodiments, first one end effector is extended into a chamber of the lower loadlock and picks the wafer from the pedestal. The end effector is then retracted from the loadlock and the second end effector is extended into the other chamber of the lower loadlock and picks the wafer from the pedestal. The robot thus picks the left and right wafers consecutively, in either order. In certain embodiments, the robot uses information about the placement of each wafer in the lower loadlock to correct wafer position during the pick move. The atmospheric robot arm is then rotated to place the wafers in the FOUP.

FOUP Place: The atmospheric robot places the wafers into stacked positions in a FOUP. In one embodiment, both wafers are placed simultaneously.

Examples of timing of ATM Robot Moves (secs):
Goto outgoing LL from incoming LL: 0.5
Get wafers from outgoing LL: 5.9
Goto cassette from outgoing LL: 1
Put wafers into cassette: 3
Retract and move in Z-direction in prep for "get" from cassette: 0.3
Get wafers from cassette: 2.5
Goto incoming LL from cassette: 1.3
Put wafers into incoming LL: 6.5

Transfer Module Robot

Figure 3G:
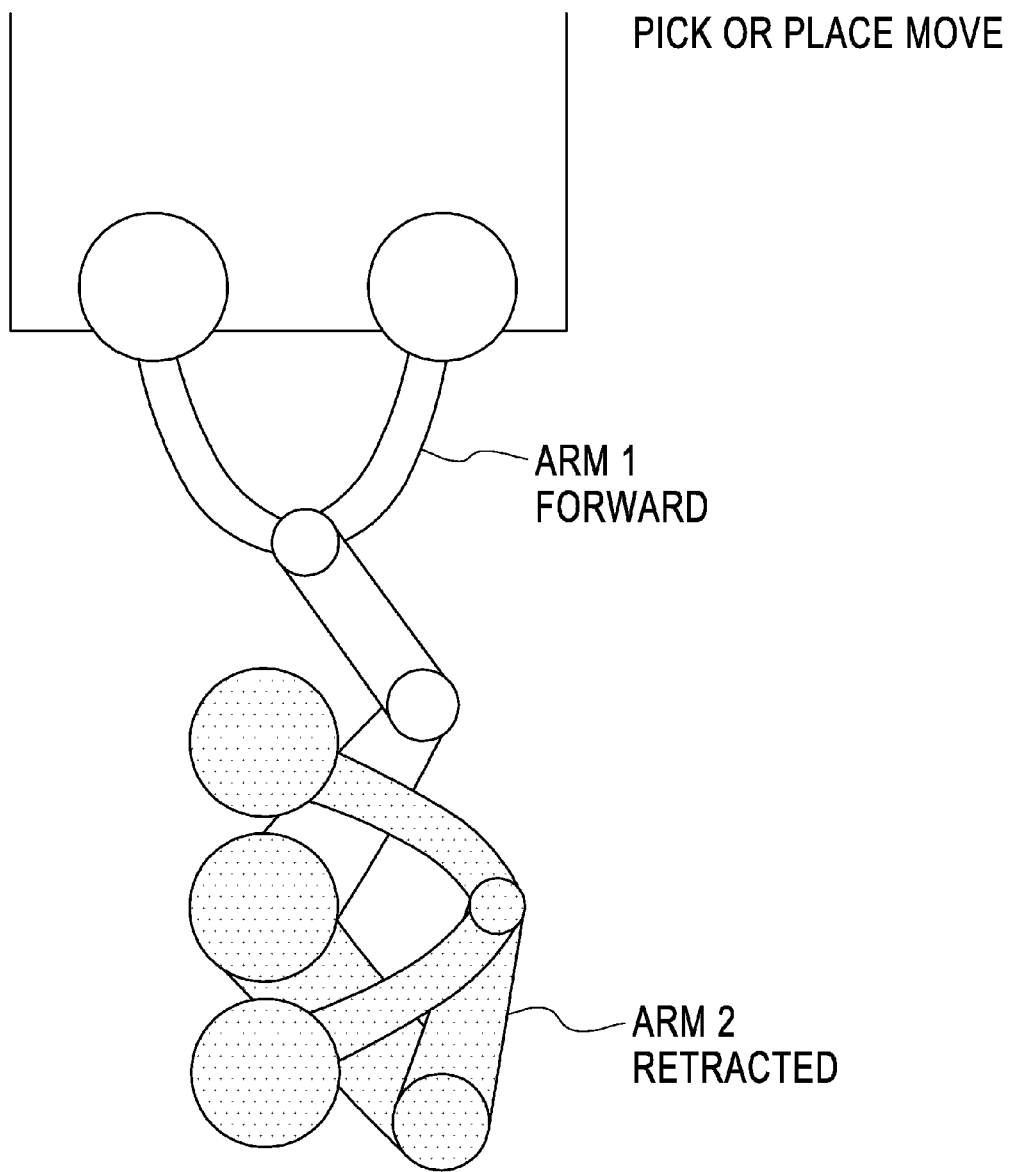
FIG. 3g shows a schematic of two arm dual end effector transfer module robot with one dual end effector arm in an extended position and the other dual end effector arm in a retracted position.

Upper LL Pick: The transfer module robot extends one dual end effector arm into the upper loadlock and lifts the wafers from the shelves onto the end effectors. In certain embodiments, as one arm is extended into the loadlock, the other arm moves into a retracted position. FIG. 3g shows a dual arm dual end effector robot with one arm extended (e.g., into a loadlock or process module for a pick or place move) and one arm retracted. In the scheme shown in Table 1, one arm is dedicated to taking unprocessed wafers from the upper loadlock and placing them in the process module (arm 1), and the other dedicated to taking processed wafers from the process module and placing them in the lower loadlock (arm 2). In other embodiments, both arms may be used for processed and unprocessed wafers. In the scheme shown in Table 1, after the upper loadlock pick move, the arm 1 retracts and arm 2 is extended into the lower loadlock to place processed wafers there.

Lower LL Place: The transfer module robot extends arm 2—having a process wafer on each end effector—into the lower loadlock and places them there. In certain embodiments, this is done simultaneously. Position information of each wafer loadlock may be measured and stored for use by the atmospheric robot in picking the wafers. The robot is then positioned for the process module pick move.

Process Module Pick: The transfer module robot extends arm 2 into the process module and picks the two processed wafers. In certain embodiments, this is done simultaneously. In the scheme shown in Table 1, after the process module pick, the transfer module robot places the unprocessed wafers into the process module.

Process Module Place: The transfer module robot extends arm 1—having two unprocessed wafers—into the process module and places them at the stations (as in FIG. 4) either by lowering the wafers onto the stations, or by wafer supports in the stations lifting the wafers off the end effectors. In certain embodiments, the place moves are done sequentially to allow position corrections to be made in each place move.

Examples of timing of various transfer module robot moves (secs):
Goto incoming LL from outgoing LL: 1.2
Goto chamber 1 (process module) from LL and goto LL (90$o$): 1.8
Goto chamber 2 from LL and goto LL (180$o$): 2.8
Incoming LL "get" (pick): 4.3
Outgoing LL "put" (place): 4.3
Wafer Exchange (processed for unprocessed at process module or chamber): 8.5

FIGS. 1-3g and the associated discussion provide a broad overview of the dual wafer processing apparatus and methods discussed herein. Details of the transfer methods according to various embodiments have been omitted and are discussed in further detail below, including wafer pick and place moves, wafer alignment, pressurization and depressurization cycles, etc. Additional details of the apparatus according to various embodiments are also discussed below.

Stacked Loadlocks

In certain embodiments stacked independent loadlocks are provided. These may be used in the dual wafer handling systems described. Single wafer handlers with multiple loadlocks can place loadlocks side-by-side allowing the space above and below the loadlocks to be used for utilities and mechanisms. Dual wafer handlers classically use one loadlock with multiple shelves. This limits the throughput of the system as venting, cooling, pumping and robot exchanges must happen in series for all incoming and outgoing wafers. The entire loadlock of a system must wait for multiple wafer exchanges at both vacuum and atmosphere before the loadlock can move onto the next operation. For example, using a single loadlock with multiple shelves, with having outbound wafers after vent/cool:

1. Atmospheric doors open
2. Atmospheric robot picks two outbound wafers from loadlock
3. Atmospheric robot moves outbound wafers to storage cassette
4. Atmospheric robot places outbound wafers in storage cassette
5. Atmospheric robot picks two inbound wafers from storage cassette
6. Atmospheric robot moves inbound wafers to loadlock
7. Atmospheric robot places inbound wafers in loadlock
8. Atmospheric doors close and pumpdown During the above sequence, the loadlock sits idle while the atmospheric robot performs the wafer transfer steps 2-7. The loadlock also must sit idle during the wafer exchanges on the vacuum side. Multi-shelf loadlocks also expose incoming and outgoing wafers to cross-contamination during pumpdown and vent/cool. Some loadlock designs require indexers to move wafers up and down, adding complexity.

The wafer handling apparatuses according to certain embodiments include stacked independent loadlocks. Loadlocks 104a and 104b in FIGS. 3a-e are stacked, independent loadlocks. By stacking independent loadlocks one on top of the other, the system operations (e.g., pumpdown, vent/cool, wafer exchanges) are decoupled, allowing various operations to be performed in parallel, allowing throughput to be increased.

Because conventional loadlocks have utilities and mechanisms above and below the loadlock chamber, a large vertical space would be required to stack conventional independent loadlocks. This would require a large z-direction transfer module robot, as well large volumes of the transfer module and the loadlocks. The stacked independent loadlocks designs compactly isolate upper and lower loadlocks and are configured for pumpdown and venting. According to various embodiments, the stacked independent load locks have a small distance from each loadlock handoff plane, e.g., around 65 mm. This allows a transfer module robot arm (or both transfer module robot arms if the are two) to reach both the upper and lower loadlocks.

According to various embodiments, the stacked loadlock assemblies described herein have one or more of the following features:

Dual wafer capacity: the loadlock can hold dual wafer (side-by-side) capacity. Thus important for dual throughput, as two wafers go through the wafer handling and processing side-by-side. (See FIGS. 3a-f).

Independent cycled stacked loadlocks: Upper and lower loadlocks are isolated from each other and are independently cycled as necessary (e.g., the upper loadlock is at vacuum conditions while the lower is atmospheric).

Compact design: The loadlock assembly is compactly designed, reducing height as compared to conventional multi-loadlock systems. In addition, the distance between hand-off planes is small obviating the need for robots with large z-direction freedom. Chamber volume may also be small so that small pumps may be used. For example, with both chambers of a loadlock are combined, the upper and lower loadlock volumes may be from about 6.0-10 L. In one example, upper loadlock volume is 6.5 L and lower loadlock volume is about 7.3 L.

Single center plate: The stacked chambers are separated by a single center plate. In dual wafer capacity loadlocks, the left upper and lower loadlock chambers are separated by a single plate, as are the right upper and lower chambers. In certain embodiments, in addition to isolating the chambers, the single center plate may have additional functionalities including providing annuluses for radial pumping and venting.

Optimized for unidirectional flow: A unidirectional loadlock handles wafers being transferred in one direction only—either inbound (atmospheric environment to transfer module) or outbound (transfer module to atmospheric environment). The mechanical design of the inbound loadlock is optimized for pumpdowns and that of the outbound loadlock for venting and cooling. In certain embodiments, the upper loadlock is optimized for inbound wafers and lower chamber is optimized for outbound wafers.

Radial pumping and/or venting: The loadlock employs radial pumping and/or venting to reduce particle contamination. In certain embodiments, the inbound loadlock pump flow vectors are radial and uniform emanating from the center of the wafer. Similarly, the outbound loadlock vent flow vectors are radial and uniform emanating from the wafer center. Because the flows emanate from the wafer center, foreign material cannot be transported to the wafer from the other areas of the loadlock chamber. If used for unidirectional flow, particle contamination of the wafer is a concern only during pumpdown in the inbound loadlock and only during venting in the outbound loadlock. In certain embodiments, the loadlock assemblies have annular recesses to facilitate radial pumping or venting by choking the pumping or venting flow.

Figure 4A:
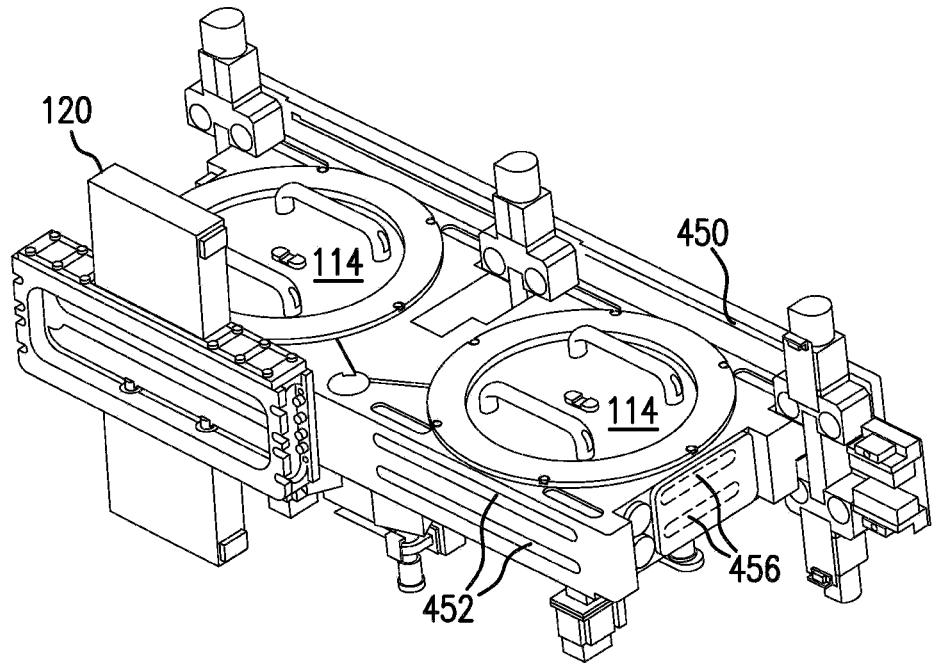
FIGS. 4a and 4b are schematics of a stacked loadlock according to certain embodiments.
Figure 4B:
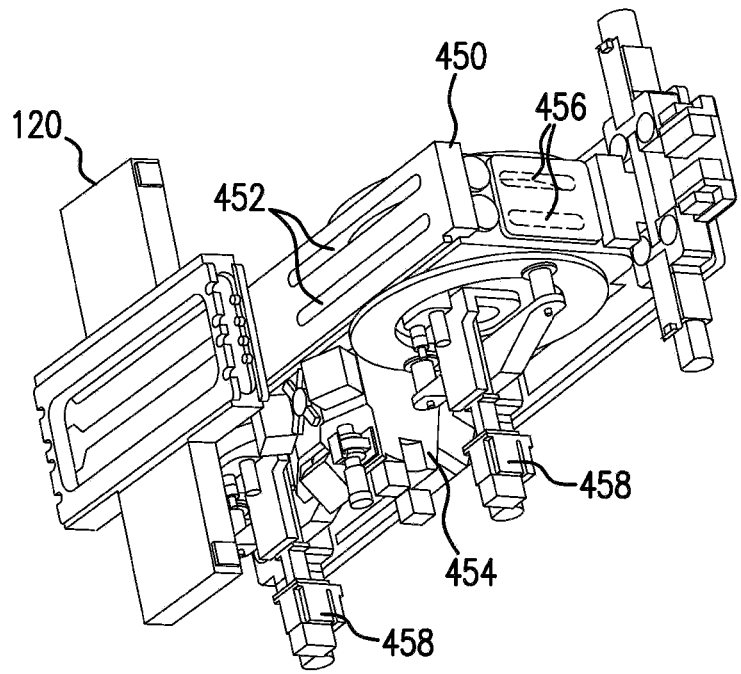

FIGS. 4a and 4b show an example of a loadlock assembly having stacked independent loadlocks. In FIGS. 4a and 4b, the transfer module side of the loadlock assembly faces front. As described above, each loadlock has two connected chambers. Lids 114 each cover one chamber of the upper loadlock. Slit valves 120 show valves allowing access from the loadlock to the transfer module on the left side of the loadlocks. The valves on the right side are not shown in the figure to provide a view of the housing 450 and the loadlock assembly openings 452 in the housing 450. In certain embodiments, the slit valves may be independently controlled but tied together pneumatically. Isolation manifold 454 leads to the loadlock pump is used for equalization and pumpdown operations. Side ports 456 allow viewing of the interior of the loadlock. Lower loadlock lift mechanism 458 is used to raise and lower the wafers from the cool plate to allow robot end effectors the clearance to pick and place wafers. This allows for a cool plate without large clearances cut for the end effectors The entire stacked independent loadlock assembly is compact—with a height of about 5 inches for the chamber, with the valve actuators being taller the depicted embodiments Openings 452 are close enough together such that a robot having a large z-direction freedom is not required. The wafer hand-off plane is the plane the robot picks or places the substrate from or into the loadlock. The distance between the upper and lower hand-off planes is important as it defines the minimum amount of vertical freedom a robot arm that transfers wafers to or from both upper and lower loadlocks must have.

Figure 5A:
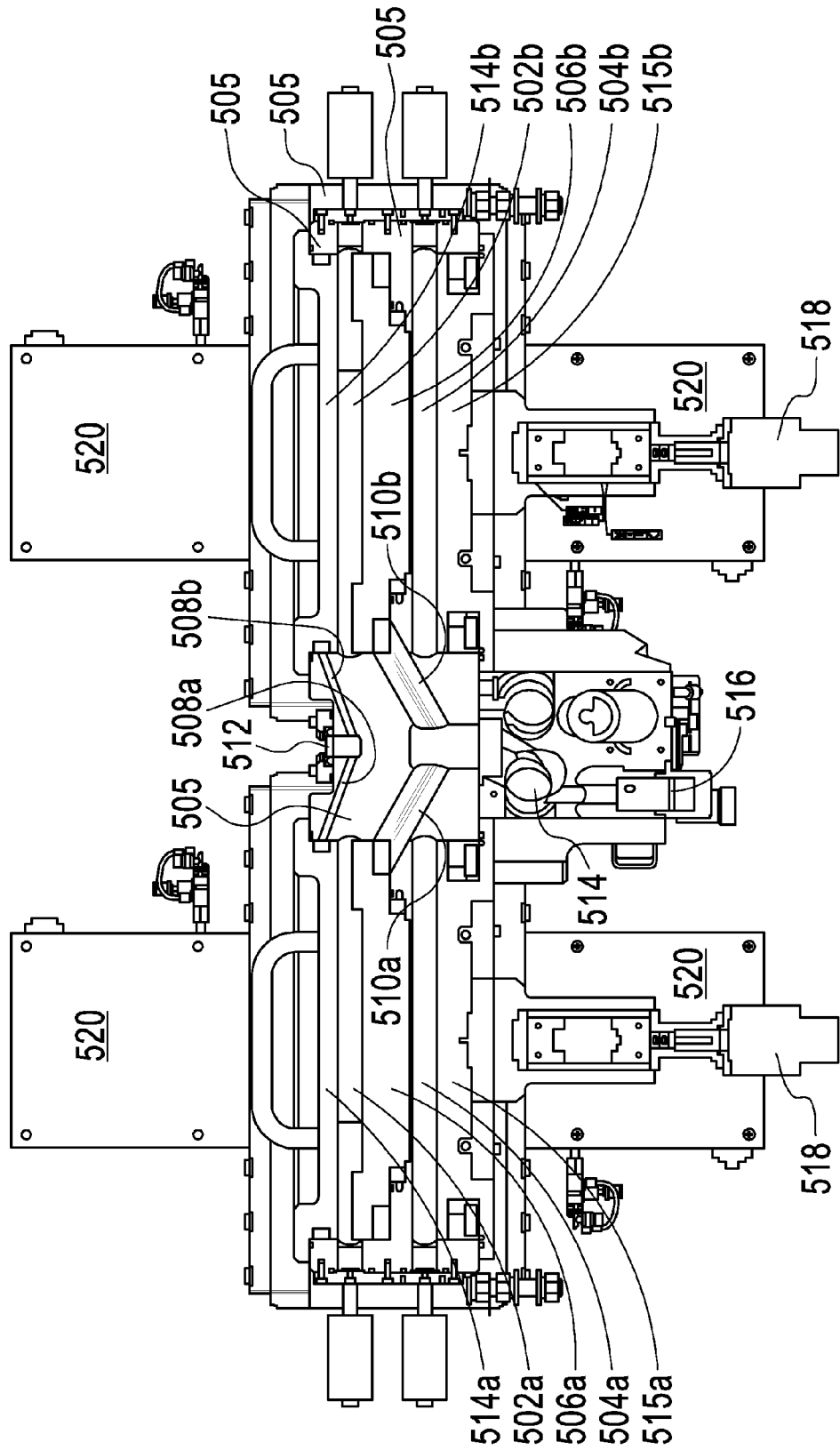
FIGS. 5a and 5b are schematics of a stacked loadlock according to certain embodiments.
Figure 5B:
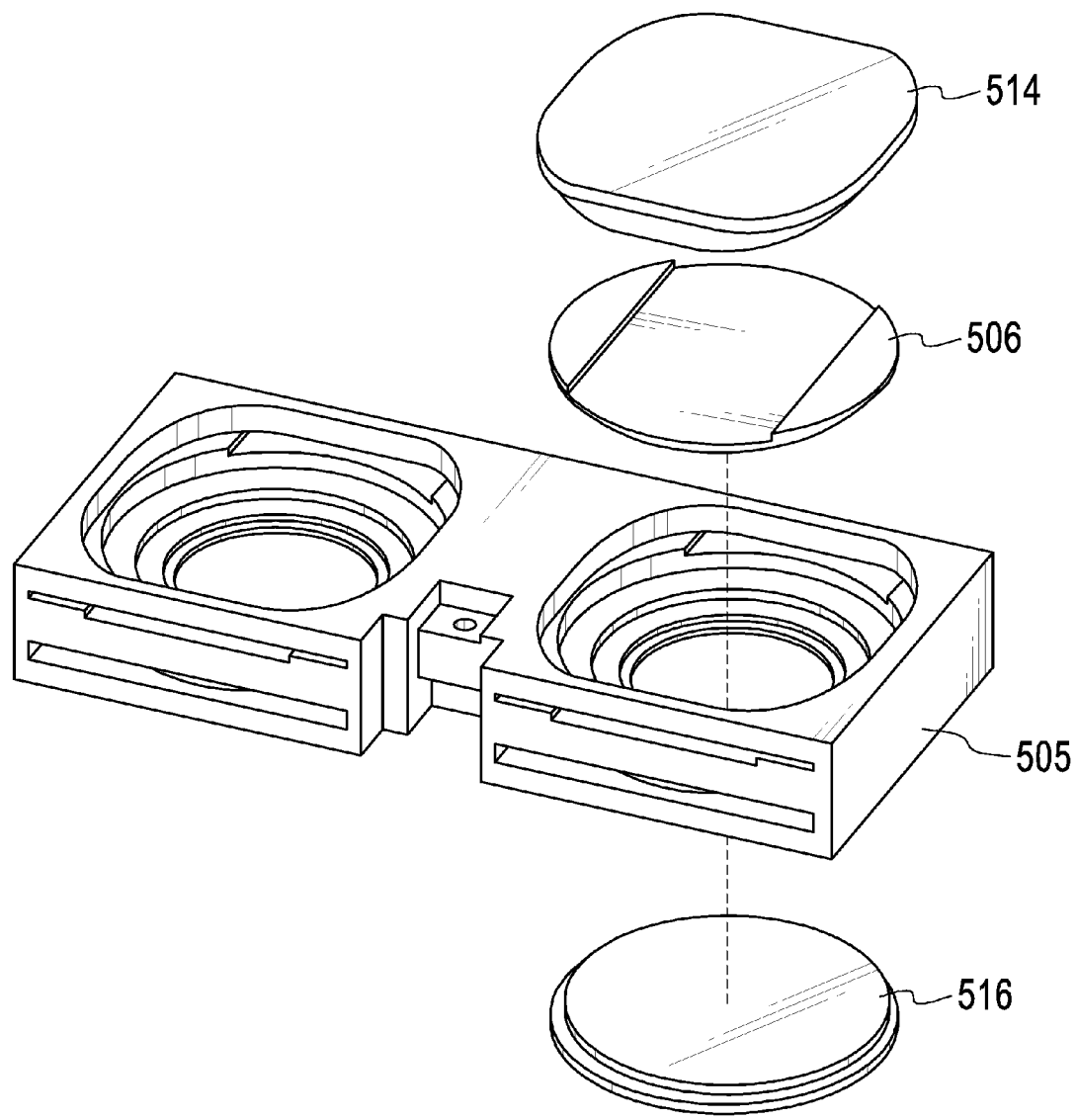

FIG. 5a shows a front view of a stacked loadlock assembly according to certain embodiments. The upper loadlock has two chambers 502a and 502b and the lower loadlock has two chambers 504a and 504b. A loadlock housing 505 provides a frame or support for the plates that define the ceilings and floors of the loadlocks. The housing also has openings for wafer exit and entry. In the embodiment depicted in FIG. 5a, the housing also defines the sidewalls for both upper and lower loadlocks and contains vent and pump channels for both loadlocks. The housing may be a single piece or multiple pieces. The upper loadlock chamber 502a is separated from the lower loadlock chamber 504a by a center plate 506a; loadlock chamber 502b is separated from the lower loadlock chamber 504b by a center plate 506b. In addition to separating the upper and lower vacuum chambers, the center plate is designed for vacuum and atmospheric pressures on both sides with cycling in both directions. In the embodiment depicted in FIGS. 5a, the stacked loadlocks have a single center plate separating each pair of stacked chambers (i.e., one center plate separating upper and lower chambers on the right side and another center plate separating upper and lower chambers on the left side). In addition to separating upper and lower chambers, the center plate is also the wafer pedestal for the upper loadlock. FIG. 5b shows an exploded view of an upper plate 514, center plate 506, lower plate 516 and housing 505. The use of the single center plate allows the distance between the wafer hand-off planes to be small—in the embodiment depicted in FIG. 5a, the distance between hand-off planes is about 65 mm.

In the embodiment depicted in FIG. 5a, the center plate is a single integral removable plate configured to allow pumping and venting as described below; however in other embodiments, multiple thin plates may be used to isolate the upper and lower loadlocks. Upper plates or lids 514a and 514b covers the upper chambers, and bottom plates 515a and 515b form the floors of the lower chambers. Bottom plates 515a and 515b may also have a cooling mechanism. Upper chambers 502a and 502b are in fluid communication are lower chambers 504a and 504b.

Channels 508a and 508b are vent channels for the upper loadlock chambers. Gases are introduced through inlet 512 and vented into the upper loadlock chambers through these channels. Channels 510a and 510b are pumpdown channels for the upper loadlock chambers. Gases are pumped by the loadlock vacuum pump or pumps (not shown) and exit through manifold 514 to outlet 516. Pump and vent designs according to certain embodiments are described further below. The pump and vent channels for the lower loadlock are behind the upper loadlock channels and are not shown in FIG. 5a, but are described further below. FIG. 5a also shows lift mechanisms 518 and vacuum slit valves housing 520.

As indicated above, the stacked loadlock assemblies are compact. The size of the assemblies may be characterized by one or more of the following: height (bottom of lower loadlock plate to top of upper loadlock plate); distance between upper and lower loadlock wafer hand-off planes, center to center distance between upper and lower loadlock openings, chamber volume, center to center distance between left and right chambers, plate diameter bore, and total depth of chamber. In the embodiment depicted in FIG. 5a, the dimensions are as follows:

Height: 6.2 inches
Distance between upper and loadlock hand-off planes: 65 mm
Center to center distance between upper and lower loadlock openings: 2.4 inches
Chamber volume: 6.5 L upper loadlock (both chambers); 7.3 L lower loadlock
Center to center distance between left and right chambers: 19 inches
Diameter bores for all plates: 13.2 inches
Total depth of chamber: 14.75 inches According to various embodiments, these dimensions range as follows:

Height: about 4-10 inches
Distance between upper and lower loadlock hand-off planes: about 30 mm-100 mm
Center to center distance between upper and lower loadlock openings: about 30 mm-100 mm
Chamber volume: about 3.0 L-20.0 L Center to center distance between left and right chambers: about 12-30 inches
Diameter bores for all plates: about 12-15 inches
Total depth of chamber: about 12-20 inches In certain embodiments, one or more of the dual wafer loadlocks have no moving parts. For example, in certain embodiments the incoming or upper load lock has no moving parts, only a shelf for the robots to set wafers on, with clearance for the end effector below the shelf. In the embodiment depicted in FIG. 5a, the lower loadlock does have a lift mechanism, which allows for better cooling performance. However, according to various embodiments, if cooling is done outside of the loadlock, either before or after moving through the outgoing loadlock or if no cooling is necessary, the outgoing loadlock would not need moving parts.

In certain embodiments, the wafer support in one or both of the loadlocks is a pair of shelves. A space under most of a wafer allows a robot arm to slide under to pick or place the wafer. The lift mechanism in the lower load lock creates this shelf for robot clearance while also allowing the wafer to be placed on the cool plate with small gaps to the wafer.

Annular Designs for Radial Uniform Top-Down Flow

Space above and below a loadlock is typically used for utilities and mechanisms in conventional loadlock systems—multiple independent loadlocks may be placed side-by-side, or require a robot having a large z-direction motion to pick up and place the wafers (or loadlocks that are translated vertically). It is desirable for robots, and transfer module robots, in particular not to be required to have large z-direction freedom.

Each loadlock requires mechanisms for pumping down (to lower the pressure before opening to the transfer module) and venting (to raise the pressure before opening to the atmospheric environment). Rapid pumpdown can create high velocity turbulent flows through the loadlock chamber. If flow vectors are not carefully managed, foreign material may be transported to the wafer surface during pumpdown. Similarly, venting can create high velocity turbulent flows that may transport particles to the wafer surface. Conventional loadlocks often have a center pumping port to pump down the loadlock chamber and/or a center venting port to vent the loadlock chamber. Conventional loadlocks may also use a vent diffuser made of sintered metal on the chamber.

Figure 6A:
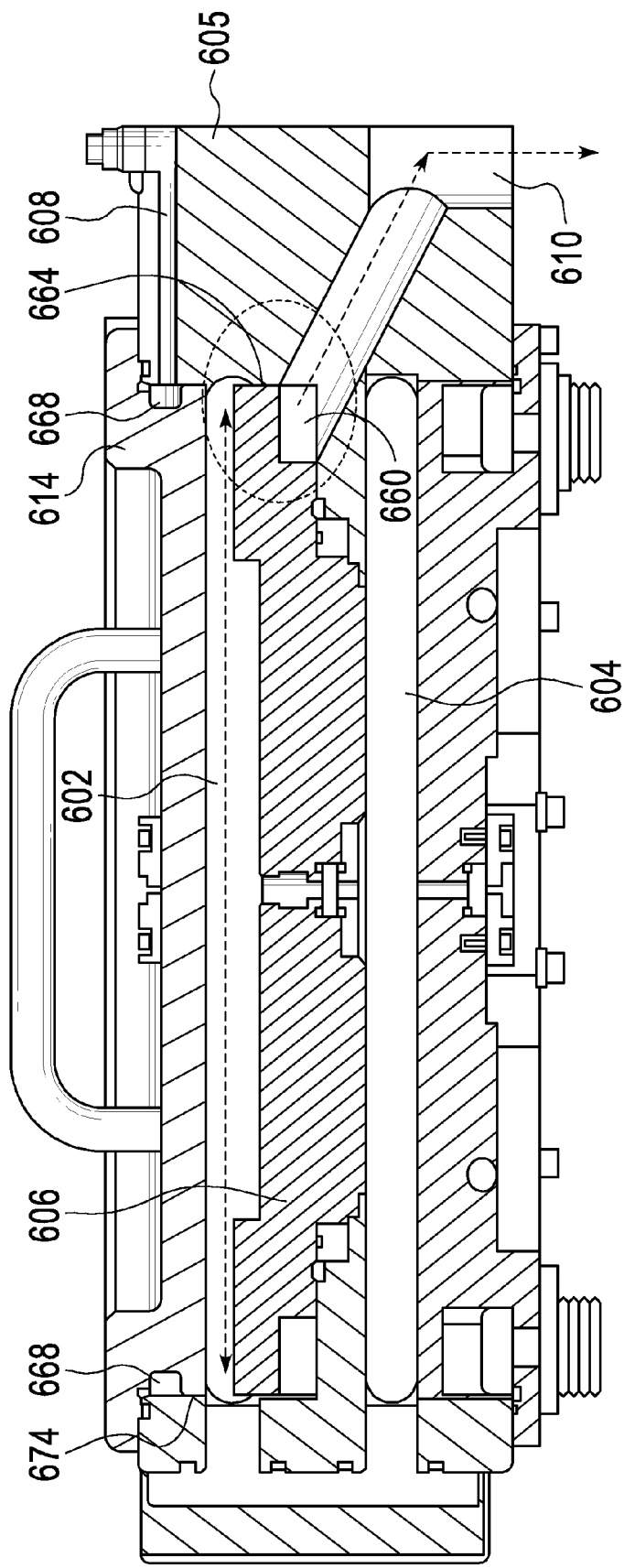
FIGS. 6a and 6b are schematics illustrating the pump and vent designs for an upper loadlock according to certain embodiments.

According to various embodiments, the loadlocks described herein each have venting and pumping ports and flow channels that permit a compact design. Notably, according to various embodiments, the designs do not require a center pumping/venting ports to ensure radial flows. According to various embodiments, the loadlock assemblies have pumping annuluses for providing uniform radial top-down flow during pumpdown and/or venting annuluses for providing uniform radial top-down flow during vent. The flow vectors are managed such that the flow emanates uniformly from the center of the wafer. Flow is also top down such that any particles are carried down and out of the chamber during pumpdown. FIGS. 6a-7b show the pump and vent designs for a stacked loadlock assembly as shown in FIGS. 4a-5a, with FIGS. 6a and 6b showing the pump and vent designs for the upper loadlock and FIGS. 7a and 7b showing the pump and vent designs for the lower loadlock.

Figure 6B:
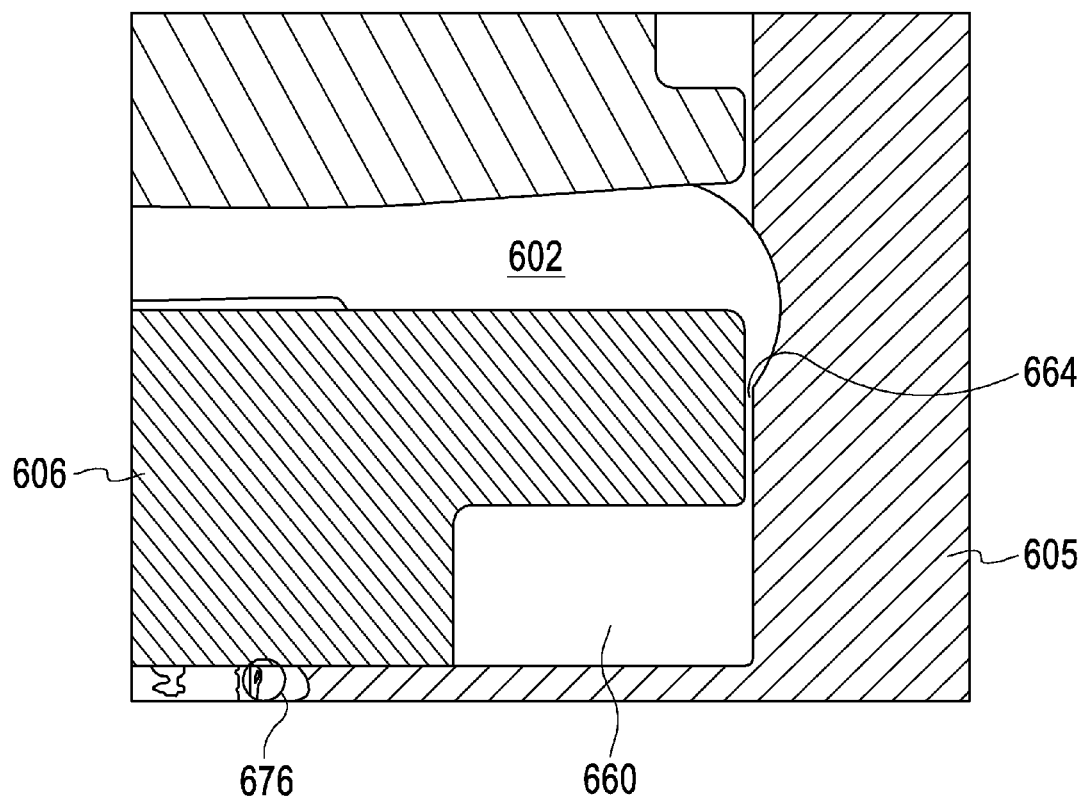
Figure 7A:
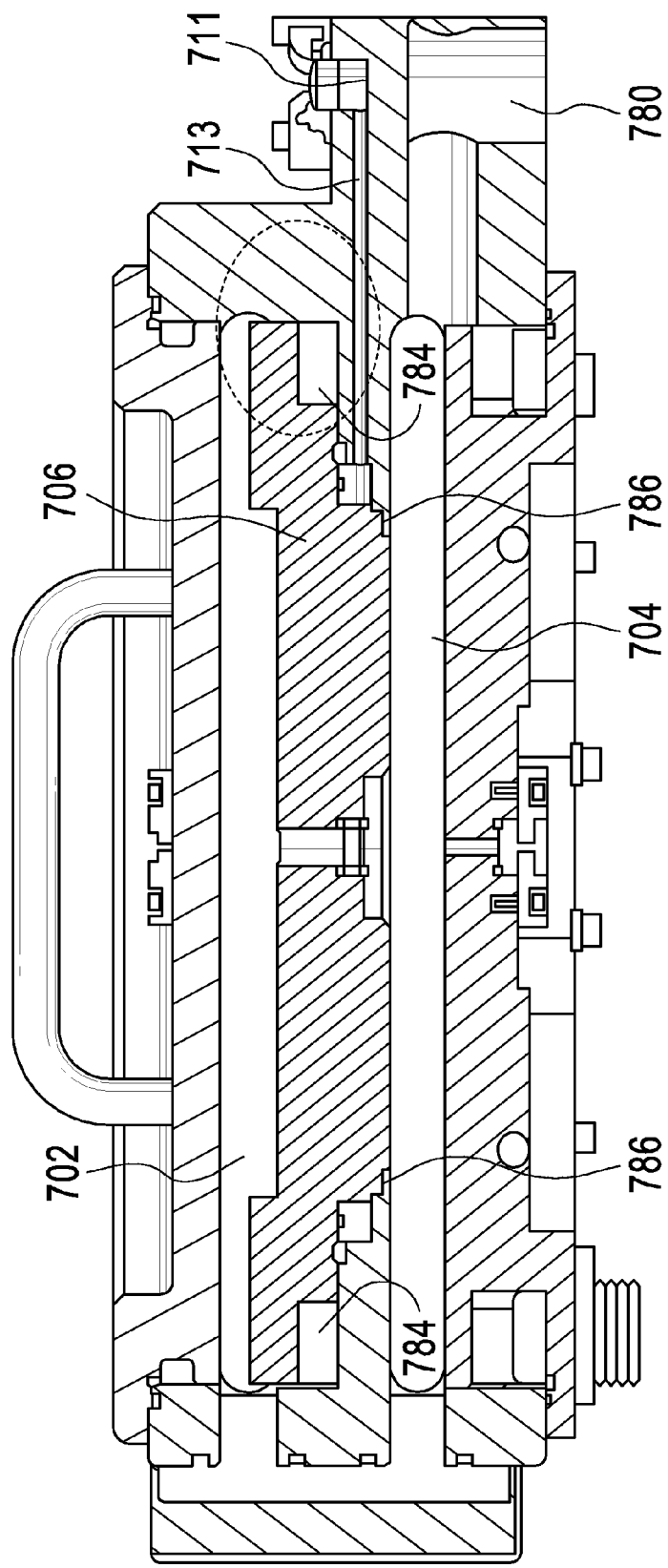
FIGS. 7a and 7b are schematics illustrating the pump and vent designs for a lower loadlock according to certain embodiments.
Figure 7B:
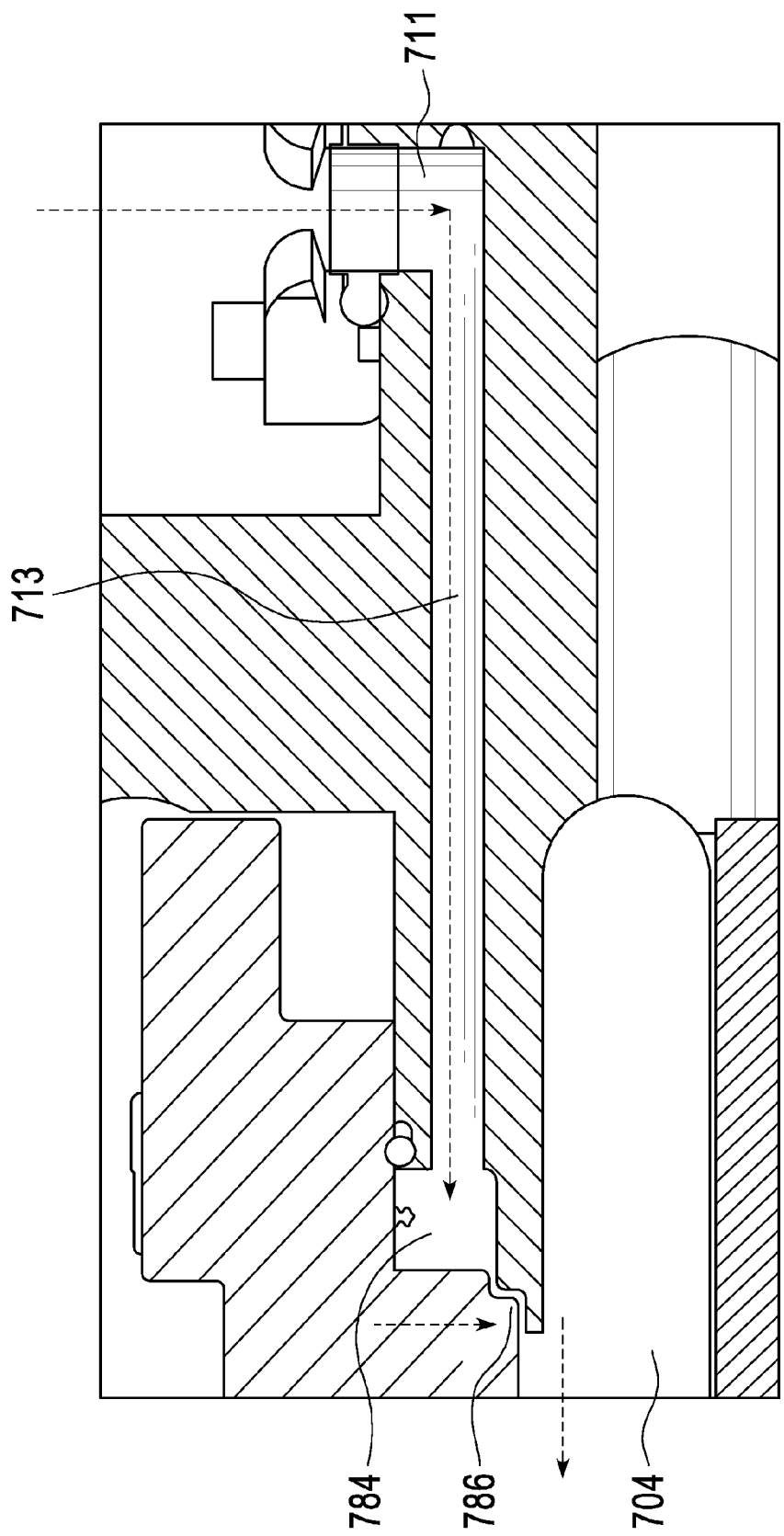

FIGS. 6a and 6b illustrate a pump annulus design for a loadlock. In the embodiment depicted in FIGS. 6a and 6b, the pump annulus design is for an upper loadlock. As described above, an upper loadlock chamber 602 is separated from a lower loadlock chamber 604 by center plate 606. During pumpdown, gases are pumped through annular gap 664 (also referred to as an annular channel) around the outside edge of the wafer position (in this case between center plate 606 and the loadlock housing 605). Below the gap an annular chamber 660 and exit port 610 are also shown, with the annular chamber 660 extending around the chamber. The annular chamber is formed by an annular recess in the center plate 606. Exit port 610 leads to a manifold below the stacked assembly. The gap 664 between center plate 606 and the loadlock housing 605 leading to the pump annulus and exit port is tight. By pumping through this tight gap, flow conductance is choked to force even pumping at all radial points around the wafer. The dotted arrows show the flow path extending radially outward from the center of the wafer to the annulus, and then down the exit port. (The lower loadlock flow channels discussed below in FIGS. 7a and 7b are not visible in FIG. 6a).

FIG. 6b shows a close-up view of the pumping annular gap and annular chamber, including upper loadlock chamber 602, center plate 606, annular gap or channel 664 and annular chamber 660. O-ring 676 is also shown. The height and width of the annular gap are uniform around the annulus and optimized. The exact dimensions of the annular gap depend on factors including the flow rate, chamber volume, chamber diameter, etc. In the embodiment depicted in FIG. 6b, the width is about 0.03 inches and the height about 0.25 inches. The use of the tight annular gap to choke the flow forces the flow to be radial. The annular chamber below the gap provides a buffer for maintaining a uniform and even flow. In particular embodiments, the annular gap is below the wafer surface so that the pumpdown flow is top to bottom to enhance particle control.

The width of the tight annular gap is small enough to force the flow to be uniform and radial, while keeping the pressure drop across the gap to be within manufacturing tolerances. If the gap is too large, all of the gas flows down on the side closest to the pump port. Very small gaps, e.g., on the order of 5-10 mils, may create pressure drops that may be hard to manage. In certain embodiments, the gap is sized so that flow is radial and moves downward everywhere reducing or minimizing particle risk, if not small enough to be perfectly uniform.

Returning to FIG. 6a, annular chamber 668 in upper plate 614 is used for venting the upper loadlock—gases from inlet port 608 go from annular chamber 668 through the annular gap 674 and into the upper loadlock chamber 602. The annular chamber and annular gap promote radial venting. The annular gap chokes the flow, causing gases to go through the annular chamber and vent into the chamber radially. In an inbound only loadlock (as used in unidirectional flow), radial venting is not as critical as radial pumping as there is no wafer in the loadlock during the venting, though may still be advantageous to provide a uniform flow curtain to water vapor when the ATM door is open. During vent, there is no wafer in the incoming loadlock, hence there is less of a need for flow control. However, when the incoming loadlock ATM door opens, a flow of gas is turned on to the loadlock that creates a curtain at the door to prevent air from coming in. The air in the mini-environment is relatively clean, but contains oxygen, water and other constituents that may be undesirable in the loadlock (during pumpdown), transfer module, and process chamber. By providing a curtain of clean inert gas such as nitrogen or argon, the majority of unwanted gasses are preventing from entering the loadlock. Because the wafer is passed through this curtain when the ATM robot places a wafer in the loadlock, managing the flow vectors as of this curtain as described means that a jet of gas flow is not directly pointed at the wafer. In other embodiments, the inbound loadlock vent flow is not radial.

The annular gap width ranges from about 0.005-0.050 inches in certain embodiments. The rectangular cross section of the annular chamber may have dimensions of between about 0.25-1.5 inches in certain embodiments. For example, in a particular embodiment, the annular chamber has a rectangular cross-section of 1.5×0.5 inches.

FIGS. 7a and 7b illustrate a vent diffuser design for a loadlock, specifically for a lower loadlock in the embodiment depicted in FIGS. 7a and 7b. Upper loadlock chamber 702 is separated from lower loadlock chamber 704 by center plate 706. The center plate 706 contains the annular recess described above for pumping down the upper loadlock chamber 702. A gas supply port 711 is located on the side of the loadlock. Gases are vented through an annular chamber 784 and then introduced to lower loadlock chamber 704 through a gap 786 (also referred to as an annular channel) located around the ceiling of the loadlock chamber. The geometry of this gap introduces flow vectors from the ceiling and toward the center of the wafer, where they curve downward toward the top surface of the wafer. These flow vectors are indicated in the figure by the dotted lines. By venting through the tight gap, flow conductance is choked to force even venting at all radial points around the top of the wafer. The flows emanate from the top of the wafer, pushing particles or other foreign material away from the wafer and preventing foreign material from being transported to the wafer from other areas of the loadlock chamber. (The upper loadlock inlet and exit ports discussed above are not visible in FIG. 7a).

A close-up view of the gap and annular chamber is shown in FIG. 7b, with the dotted arrows indicating the flow vectors. Vent gases enter from the supply or inlet port 711 and directed through channel 713 to the annular chamber 784. The gases are then introduced to loadlock through the annular gap 786. The gap is stepped so that flow enters the chamber parallel to the wafer, with the resulting flow vectors shown in FIG. 7a. Because the tight gap chokes the flow, filling annular chamber 784 with the vent gases, the gases are introduced radially and uniformly over the wafer. The gap may extend over the wafer such that the entry point of the gas into the chamber is between the edge and center of the wafer. In one example the entry point is at about 8 inches (~200 mm) diameter for a 300 mm wafer.

In the embodiment depicted in FIG. 7b, the lower loadlock is optimized for outbound wafers in unidirectional flow. The lower loadlock is pumped down from the side at exit port 780—because the loadlock is optimized for outbound wafers, wafers are typically not present during the pumpdown operation and so the flow vectors are not critical to managing contamination.

In the stacked loadlock assemblies depicted in the above figures, a single center plate as discussed above is used to separate the upper and lower chambers. This plate also creates the annular volumes for the upper loadlock pumping annulus and the lower loadlock venting annulus. The center plate also creates the gaps for the pumpdown flow choking and acts as the vent gas flow choke path and mechanical diffuser.

The annular designs for uniform radial flow during pumpdown and vent have been described above in the context of a stacked loadlock assembly with the upper loadlock optimized for inbound wafers and the lower loadlock optimized for outbound wafers. According to various embodiments, the annular designs for vent and/or pumpdown are used in other types of loadlock assemblies. For example, a single stacked or unstacked loadlock may have two annular gaps and chambers to manage flow vectors during both pump and vent (one such embodiment is shown above in FIG. 6a, which has a pump and a vent annulus.) One of skill in the art will also understand from the above description how to optimize an upper loadlock of a stacked loadlock assembly for outbound wafers and a lower loadlock for inbound wafers.

To create top-down flows to push particles away from the wafers, the annular gap is typically below the wafer support for pumpdown and the annular gap is typically above the wafer support for vent. However, in certain embodiments, the annular gaps may be otherwise placed (e.g., due to other design considerations). In another example, in certain embodiments, a loadlock may have an annular gap and chamber for pumpdown combined with a central port for the other operation. The designs may be used with both unidirectional and bidirectional loadlocks.

In the figures above, the annular gaps are defined by a plate and the loadlock housing or sidewall: the upper loadlock pump gap 664 in FIGS. 6a and b is defined by the center plate and the housing or sidewall, the lower loadlock vent gap 786 in FIGS. 7a and 7b is also defined by the center plate and a sidewall, and the upper loadlock vent gap 674 in FIG. 6a is defined by the upper plate and the housing or sidewall. The annular chambers are formed by annular recesses in the center or upper plate. According to various embodiments, the annular gaps and chambers may be formed by any appropriate structure, e.g., an annular recess in the loadlock housing, that may be used to form a flow path as described above. Any structure that chokes the flow through an annular gap may be used.

The annular gap (annular channel width) ranges from about 005-0.050 inches in certain embodiments. The rectangular cross section of the annular chamber may have dimensions of between about 0.25-1.5 inches in certain embodiments. For example, in a particular embodiment, the annular chamber has a rectangular cross-section of 0.5×0.5 inches.

What is claimed:

1. An apparatus comprising:
a loadlock chamber including a chamber floor and a chamber lid, wherein the chamber floor and chamber lid at least partially define a chamber volume configured to house a substrate;
a first annular channel;
a first annular chamber connected to the first annular channel, wherein the width of the first annular channel is smaller than that of the first annular chamber, wherein the first annular channel and the first annular chamber partially define a first flow path between the chamber volume and an exterior environment, wherein the chamber floor at least partially defines the first annular channel and the first annular chamber, and wherein the first annular chamber is below the first annular channel.

2. The apparatus of claim 1, wherein the chamber floor is a plate.

3. The apparatus of claim 1, further comprising a second annular channel and second annular chamber, wherein the width of the second annular channel is smaller than that of the second annular chamber, wherein the second annular channel and the second annular chamber partially define a second flow path between the chamber volume and an exterior environment.

4. The apparatus of claim 1, further comprising one or more substrate supports within the loadlock chamber.

5. The apparatus of claim 4, wherein the second loadlock chamber is separated from the loadlock chamber by a center plate.

6. The apparatus of claim 4, wherein at least one of the first annular channel and the first annular chamber are formed in the center plate.

7. The apparatus of claim 1, wherein the width of the first annular channel between about 0.005 and 0.050 inches.

8. The apparatus of claim 1, wherein the width of the first annular chamber is between about 0.25 and 1.5 inches.

9. The apparatus of claim 1, further comprising a second loadlock chamber.

10. An apparatus comprising:
a loadlock chamber including a chamber floor and a chamber lid wherein the chamber floor and chamber lid at least partially define a chamber volume configured to house a substrate;
a first annular channel;
a first annular chamber connected to the first annular channel, wherein the width of the first annular channel is smaller than that of the first annular chamber, wherein the first annular channel and the first annular chamber partially define a first flow path between the chamber volume and an exterior environment, wherein the chamber lid at least partially defines the first annular channel and the first annular chamber, and wherein the first annular channel is configured such that a flow entering the chamber volume from the first annular channel is parallel to the chamber lid and directed radially inward.

11. The apparatus of claim 10, wherein the chamber lid is a plate.

12. The apparatus of claim 10, wherein the first annular channel is stepped.

\* \* \* \* \*